(12) United States Patent
Chia et al.

(10) Patent No.: US 7,884,007 B2
(45) Date of Patent: Feb. 8, 2011

(54) SUPER HIGH DENSITY MODULE WITH INTEGRATED WAFER LEVEL PACKAGES

(75) Inventors: Yong Poo Chia, Singapore (SG); Suan Jeung Boon, Singapore (SG); Siu Waf Low, Singapore (SG); Yong Loo Neo, Singapore (SG); Bok Leng Ser, Singapore (SG)

(73) Assignee: Micron Technology, Inc., Boise, ID (US)

( * ) Notice: Subject to any disclaimer, the term of this patent is extended or adjusted under 35 U.S.C. 154(b) by 169 days.

(21) Appl. No.: 11/830,377

(22) Filed: Jul. 30, 2007

(65) Prior Publication Data
US 2007/0264751 A1    Nov. 15, 2007

Related U.S. Application Data

(62) Division of application No. 10/963,346, filed on Oct. 12, 2004, now Pat. No. 7,368,374, which is a division of application No. 10/167,284, filed on Jun. 11, 2002, now Pat. No. 7,579,681.

(30) Foreign Application Priority Data
May 21, 2002   (SG)   ............................. 200203050-0

(51) Int. Cl.
   *H01L 21/44*   (2006.01)
(52) U.S. Cl. ................................ 438/613; 257/E23.021
(58) Field of Classification Search ................ 438/613; 257/E23.021
See application file for complete search history.

(56) References Cited

U.S. PATENT DOCUMENTS

| | | | |
|---|---|---|---|
| 3,189,978 A | 6/1965 | Stetson | |
| 3,216,028 A | 11/1965 | Wyatt | |
| 3,835,530 A | 9/1974 | Kilby | |
| 4,783,695 A | 11/1988 | Eichelberger et al. | |
| 4,918,811 A | 4/1990 | Eichelberger et al. | |
| 4,937,203 A | 6/1990 | Eichelberger et al. | |
| 5,108,825 A | 4/1992 | Wojnarowski et al. | |

(Continued)

FOREIGN PATENT DOCUMENTS

JP   404107846   4/1992

(Continued)

*Primary Examiner*—Matthew S Smith
*Assistant Examiner*—John M Parker
(74) *Attorney, Agent, or Firm*—Whyte Hirschboeck Dudek SC

(57) ABSTRACT

A wafer level package, and a semiconductor wafer, electronic system, and a memory module that include one or more of the wafer level packages, and methods of fabricating the die packages on a wafer level, and integrated circuit modules that include one or more packages are provided. In one embodiment, the die package comprises a redistribution layer interconnecting two or more dies disposed on a substrate, typically a semiconductor wafer, the redistribution layer including a first trace connecting a bond pad of each of two dies, and a second trace connecting one of the bond pads of the two dies to a ball pad. The die package of the invention can comprise memory devices such as static random access memories (SRAMs), and can be incorporated into a variety of electronic systems as part of a memory package such as single in line memory modules (SIMMs) or dual in line memory modules.

22 Claims, 20 Drawing Sheets

U.S. PATENT DOCUMENTS

| | | |
|---|---|---|
| 5,157,589 A | 10/1992 | Cole et al. |
| 5,172,214 A | 12/1992 | Casto |
| 5,250,843 A | 10/1993 | Eichelberger |
| 5,291,066 A | 3/1994 | Neugebauer et al. |
| 5,302,849 A | 4/1994 | Cavasin |
| 5,324,687 A | 6/1994 | Wojnarowski |
| 5,353,498 A | 10/1994 | Fillion et al. |
| 5,366,906 A | 11/1994 | Wojnarowski et al. |
| 5,455,459 A | 10/1995 | Fillion et al. |
| 5,527,741 A | 6/1996 | Cole et al. |
| 5,532,614 A | 7/1996 | Chiu |
| 5,731,222 A | 3/1998 | Malloy et al. |
| 5,818,102 A | 10/1998 | Rostoker |
| 5,841,193 A | 11/1998 | Eichelberger |
| 5,851,911 A | 12/1998 | Farnworth |
| 5,858,815 A | 1/1999 | Heo et al. |
| 5,866,952 A | 2/1999 | Wojnarowski et al. |
| 5,903,058 A | 5/1999 | Akram |
| 5,910,687 A | 6/1999 | Chen et al. |
| 6,025,995 A | 2/2000 | Marcinkiewicz |
| 6,046,101 A | 4/2000 | Dass et al. |
| 6,121,688 A | 9/2000 | Akagawa |
| 6,133,065 A | 10/2000 | Akram |
| 6,144,102 A | 11/2000 | Amagai |
| 6,214,630 B1 | 4/2001 | Hsuan et al. |
| 6,228,548 B1 | 5/2001 | King et al. |
| 6,228,684 B1 | 5/2001 | Maruyama |
| 6,277,670 B1 | 8/2001 | You |
| 6,291,894 B1 | 9/2001 | Farnworth et al. |
| 6,344,401 B1 | 2/2002 | Lam |
| 6,358,833 B1 | 3/2002 | Akram |
| 6,396,148 B1 | 5/2002 | Eichelberger et al. |
| 6,397,685 B1 | 6/2002 | Cook et al. |
| 6,403,448 B1 | 6/2002 | Reddy |
| 6,428,641 B1 | 8/2002 | Yoon et al. |
| 6,469,356 B2 | 10/2002 | Kumagai et al. |
| 6,472,745 B1 | 10/2002 | Iizuka |
| 6,479,887 B1 | 11/2002 | Yoon et al. |
| 6,486,005 B1 | 11/2002 | Kim |
| 6,586,275 B2 | 7/2003 | Kim et al. |
| 6,611,052 B2 | 8/2003 | Poo et al. |
| 6,627,991 B1 | 9/2003 | Joshi |
| 6,656,827 B1 | 12/2003 | Tsao et al. |
| 6,686,615 B1 | 2/2004 | Cheng et al. |
| 6,710,454 B1 | 3/2004 | Boon |
| 6,720,212 B2 | 4/2004 | Robl et al. |
| 6,747,348 B2 | 6/2004 | Jeung et al. |
| 6,750,547 B2 | 6/2004 | Jeung et al. |
| 6,759,311 B2 | 7/2004 | Eldridge et al. |
| 6,762,431 B2 | 7/2004 | Maruyama |
| 6,828,174 B2 | 12/2004 | Katagiri et al. |
| 6,867,502 B2 | 3/2005 | Katagiri et al. |
| 6,885,101 B2 | 4/2005 | Storli |
| 6,894,399 B2 | 5/2005 | Vu et al. |
| 6,909,184 B2 | 6/2005 | Ushijima et al. |
| 7,071,487 B2 | 7/2006 | Maruyama |
| 7,368,374 B2 | 5/2008 | Chia et al. |
| 7,399,990 B2 | 7/2008 | Maruyama |
| 7,579,681 B2 | 8/2009 | Chia et al. |
| 7,595,222 B2 | 9/2009 | Shimoishizaka et al. |
| 7,642,551 B2 | 1/2010 | Maruyama |
| 2001/0033031 A1 | 10/2001 | Shibata |
| 2001/0042901 A1 | 11/2001 | Maruyama |
| 2001/0046168 A1 | 11/2001 | Barth et al. |
| 2002/0038890 A1 | 4/2002 | Ohuchi |
| 2002/0047210 A1 | 4/2002 | Yamada et al. |
| 2002/0177294 A1 | 11/2002 | Otaki et al. |
| 2002/0190336 A1 | 12/2002 | Shimizu et al. |
| 2004/0166662 A1 | 8/2004 | Lei |
| 2004/0183213 A1 | 9/2004 | Hsu et al. |
| 2005/0056945 A1 | 3/2005 | Lunde et al. |
| 2005/0095750 A1 | 5/2005 | Lo et al. |
| 2005/0218473 A1 | 10/2005 | Wakisaka |
| 2005/0245061 A1 | 11/2005 | Satoh et al. |
| 2007/0105346 A1 | 5/2007 | Beroz et al. |
| 2007/0128835 A1 | 6/2007 | Yang et al. |
| 2007/0145458 A1 | 6/2007 | Asami |
| 2007/0152327 A1 | 7/2007 | Chia et al. |
| 2007/0264751 A1 | 11/2007 | Chia et al. |

FOREIGN PATENT DOCUMENTS

| | | |
|---|---|---|
| JP | 408162456 | 6/1996 |
| JP | 363312648 | 12/1998 |

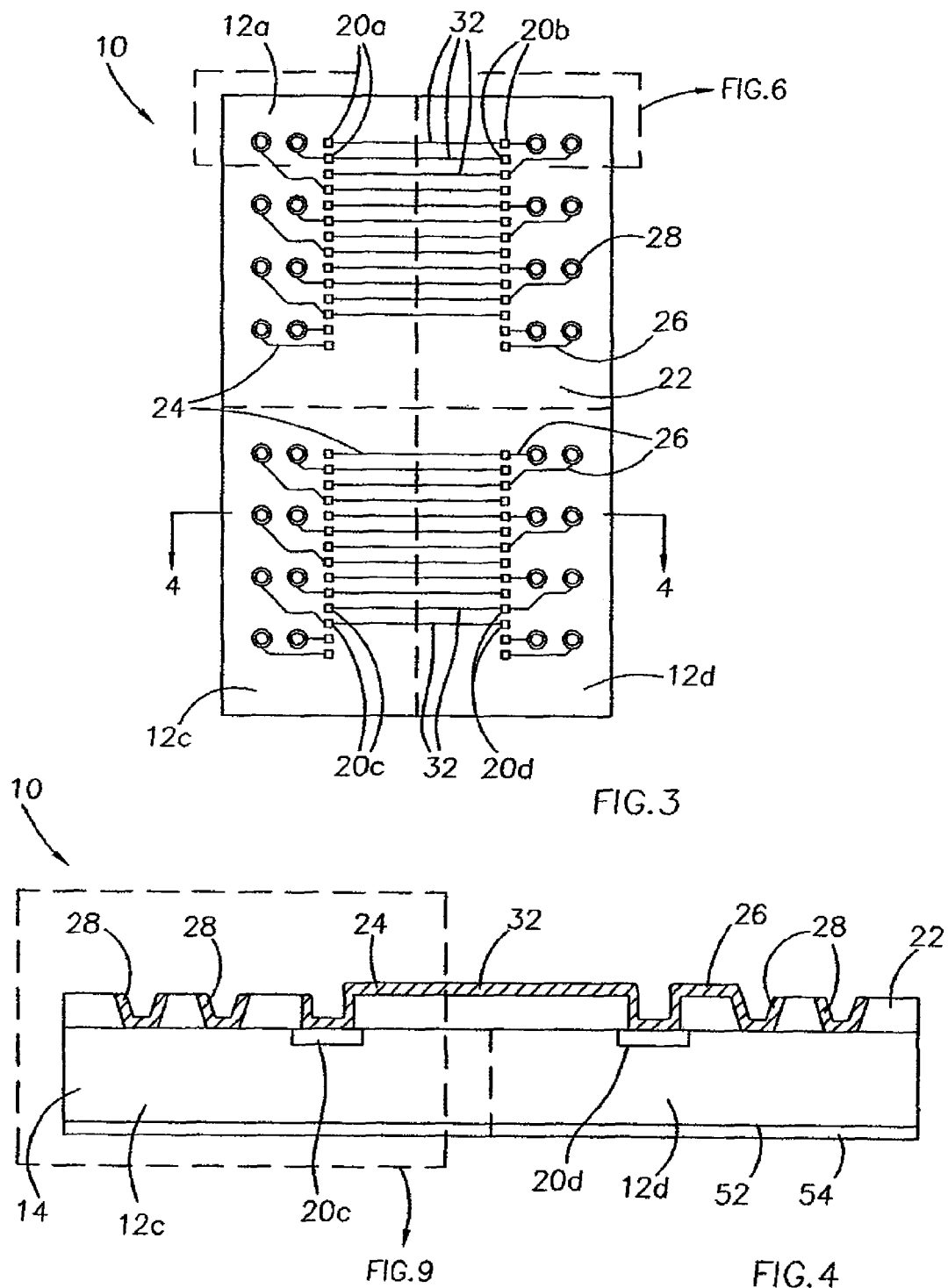

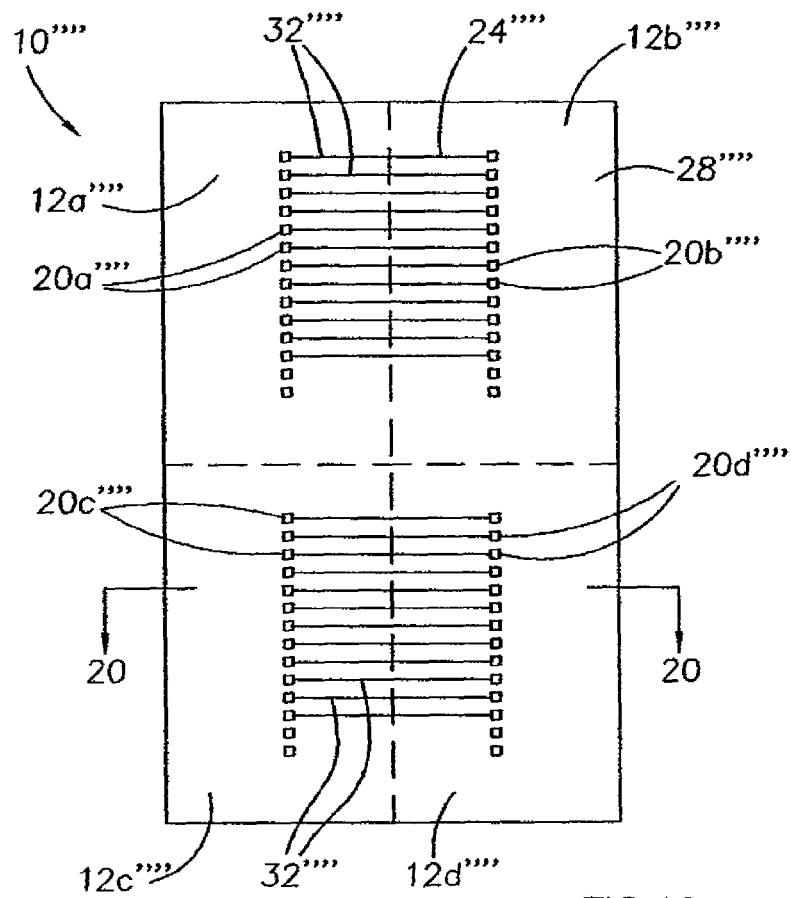
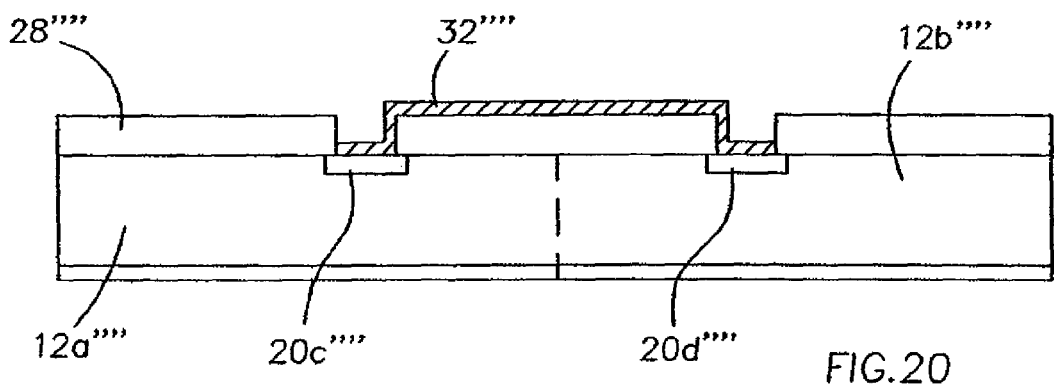

US 7,884,007 B2

SUPER HIGH DENSITY MODULE WITH INTEGRATED WAFER LEVEL PACKAGES

CROSS-REFERENCE TO RELATED APPLICATION

This application is a divisional of U.S. patent application Ser. No. 10/963,346, filed Oct. 12, 2004, which is a divisional of U.S. patent application Ser. No. 10/167,284, filed Jun. 11, 2002, which claims priority to Singapore Patent Application No. 200203050-0, filed May 21, 2002.

FIELD OF THE INVENTION

This invention relates generally to integrated circuit chip packages, and more specifically to a method of forming an integrated circuit package at a wafer level.

BACKGROUND OF THE INVENTION

With the increase in memory needed by software, the trend in state-of-the-art microprocessors is toward higher performance, high-density memory modules, such as single in-line memory modules (SIMMs) or dual in-line memory modules (DIMMs), which are circuit cards with memory chips attached. Having higher capacity memory chip units or packing more memory chip units on a memory module is one way to increase memory density on a module.

Conventional methods of mounting multiple die units on a module is through stacking the die units or attaching a daughter board to the main module board. However, a profusion of small electronic products such as pages and cellular telephones demand small product size and low profile products. The demand by consumers for miniature electronic devices has increased the need for powerful yet compact, ultra-thin semiconductor devices.

Based on these and other needs and deficiencies, an improved die package for achieving a high density memory module would be desirable.

SUMMARY OF THE INVENTION

The present invention provides a wafer level semiconductor die package, a semiconductor wafer comprising one or more wafer level packages, an electronic system comprising an integrated circuit module that includes one or more of the wafer level packages, a memory module comprising a printed circuit board and an integrated circuit module that includes at least one of the wafer level packages, and methods of fabricating the die packages on a wafer level, and integrated circuit modules that include one or more packages.

In one aspect, the invention provides a die package. In one embodiment, the die package comprises a redistribution layer interconnecting two or more dies disposed on a substrate, typically a semiconductor wafer, the redistribution layer comprising a first trace connecting a bond pad of each of two dies, and a second trace connecting one of the bond pads of the two dies to a ball pad. The die package can further include an insulating layer disposed over the traces, and/or a ball contact mounted on the ball pad.

In another embodiment, the die package is an integrated wafer level package comprising a plurality of electrically conductive traces disposed on an insulating film overlying two or more dies disposed on a semiconductor wafer or other substrate, each die comprising one or more bond pads, and each of the bond pads exposed through an opening in the insulating film; a redistribution layer comprising a plurality of traces and ball pads disposed on the insulating film, and a first trace of the redistribution layer interconnecting a bond pad of a first die to the bond pad of a second die, and a second trace connecting one of said bond pads to a ball pad disposed on the insulating film. Thus, a trace connects each bond pad of the dies to either a ball pad or to the bond pad of another die which bond pad is connected by a trace to a ball pad.

In another embodiment, the die package comprises an integrated wafer level package, comprising a support substrate, typically a semiconductor wafer, comprising at least three semiconductor dies, each die comprising a plurality of bond pads; an insulating film disposed over the dies with openings exposing the bond pads of the dies; a plurality of traces and ball pads disposed on the insulating film; a bond pad of each of a first die and second die interconnected by a trace, and one of said bond pads of the first and second dies connected by a trace to a ball pad; an insulating layer disposed over the traces; and a plurality of traces disposed on the insulating layer, including a trace connecting a bond pad of either the first die or the second die to a bond pad of a third die.

In yet another embodiment, the die package comprises an integrated wafer level package, comprising a semiconductor wafer or other support substrate comprising three or more semiconductor dies, each die comprising one or more bond pads, and a first redistribution layer including a trace interconnecting a bond pad of each of a first die and a second die; an insulating layer disposed over the first redistribution layer and comprising openings exposing the bond pads of the dies; and a second redistribution layer comprising a plurality of traces disposed on the insulating layer, including a trace interconnecting a bond pad of either the first die or the second die to a bond pad of a third die; wherein one of the bond pads of the first, second or third dies is connected by a trace to a ball pad within the package. The first redistribution layer can be disposed on an insulating film overlying the dies. The ball pad can be part of the first redistribution layer and connected by a trace to one of the bond pads of the first and second dies, or part of the second redistribution layer with a trace of the second redistribution layer connecting the bond pad of any of the first, second or third dies to the ball pad.

In yet another embodiment, the die package comprises an integrated wafer level package, comprising a semiconductor wafer or other support substrate comprising two or more dies, each die comprising a plurality of bond pads; an insulating film disposed over the dies, the film comprising openings aligned with and exposing the bond pads of the dies; a first redistribution layer disposed on the insulating film and including a trace interconnecting a bond pad of each of a first die and a second die; a first insulating layer disposed over the first redistribution layer and comprising openings exposing at least one of the first traces; a second insulating layer disposed over the first insulating layer and comprising openings exposing the first trace(s) and openings for ball pads; and a second redistribution layer comprising a ball pad and a trace disposed on the second insulating layer, and a via interconnect disposed in the opening onto the first trace, the second trace connecting the via interconnect to the ball pad.

In another aspect, the invention provides a semiconductor wafer. In various embodiments, the wafer comprises one or more wafer level packages according to the invention.

In another aspect, the invention provides an electronic system comprising an integrated circuit module comprising at least one wafer level package according to the invention. In one embodiment the integrated circuit module comprises a multi-chip module, such as a DIMM board, among others.

In yet another aspect, the invention provides a memory module comprising a printed circuit board and an integrated circuit module comprising at least one wafer level package according to the invention. In one embodiment, the memory module can comprise an integrated circuit module in the form of a DIMM board or other multi-chip module.

In a further aspect, the invention provides methods of fabricating the foregoing die packages on a wafer level. In an embodiment of a method of fabricating a die package on a wafer level, the method comprises forming a redistribution layer over at least two dies disposed on a semiconductor wafer or other support substrate, the redistribution layer comprising a plurality of traces and one or more ball pads including a trace connecting a bond pad of each of a first and second die, and a trace connecting one of the bond pads to a ball pad.

In another embodiment of a method of fabricating a wafer level die package, the method comprises providing a substrate having a plurality of semiconductor dies formed thereon, each die comprising one or more bond pads; applying an insulating film over the substrate; forming openings through the insulating film to the bond pads of the dies; and forming a redistribution layer over the insulating film, the redistribution layer comprising a plurality of traces and ball pads, including a trace interconnecting a bond pad of each of a first die and a second die, and a trace connecting one of the bond pads of the first and second dies to a ball pad. The method can further include steps of applying an insulating layer over the redistribution layer and forming openings through the insulating layer to the ball pads, and mounting a ball contact on each of the ball pads. In another embodiment, the insulating layer can be applied over the redistribution layer and openings formed to the bond pads and ball pads, and a second redistribution comprising a plurality of traces can be formed over the insulating layer, including a trace interconnecting a bond pad of either the first die or the second die to a bond pad of a third die.

In yet another embodiment of a method of fabricating a die package on a wafer level, the method comprises forming a first redistribution layer over a plurality of dies disposed on a semiconductor wafer or other substrate, including a trace interconnecting a bond pad of each of a first die and a second die; applying an insulating layer over the traces which includes openings to the bond pads of the dies; and forming a second redistribution layer comprising a plurality of traces and ball pads over the insulating layer, including a trace interconnecting a bond pad of either the first or the second die to a bond pad of a third die; wherein a trace of either the first or second redistribution layers connects one of said bond pads of the first, second or third dies to a ball pad. The ball pad can be provided as part of the first redistribution layer formed on an insulating film overlying the dies whereby the ball pad is connected by a trace to one of the interconnected bond pads of the first or second dies. In another embodiment, the ball pad can be provided as part of the second redistribution layer, connected by a trace to one of the interconnected bond pads of the first, second or third dies.

In yet another embodiment of a method of fabricating a die package on a wafer level, the method comprises forming a first redistribution layer over at least two dies disposed on a substrate, the first redistribution layer comprising a plurality of traces including a trace connecting a bond pad of each of the two dies; forming an insulating layer over the first redistribution layer; forming openings through the insulating layer to expose each of the traces of the first redistribution layer; and forming a second redistribution layer over the insulating layer, the second redistribution layer comprising a plurality of ball pads and traces, and a via interconnect disposed in each of the openings of the insulating layer in contact with the trace of the first RDL, the trace of the second RDL connecting the via interconnect to at least one ball pad. The method can further comprise the steps of forming an insulating layer over the second redistribution layer; forming openings to expose the ball pads; and connecting ball contacts to the ball pads of the second redistribution layer; and further singulating the wafer to form individual packages, each package comprising the first and second dies connected by the traces of the first redistribution layer.

In another aspect, the invention provides methods for fabricating an integrated circuit module. In one embodiment, the method comprises the steps of providing a substrate comprising a plurality of wafer level packages according to the invention; separating each package on the substrate to form individual packages; and assembling one or more packages into an integrated circuit module, for example, a multi-chip module such as a DIMM board.

The present invention provides a multiple die package having an exceptionally high memory capacity with a low profile. The die package achieves a single unit (die package) having an increased memory capacity using current memory chips by virtue the interconnections between two or more chips within the package, without having to wait for the availability of the next higher density chip. The integrated wafer package also has the advantage of space saving on a module board due to the compact and thin profile, which in turn allows more integrated units/packages and higher memory capacity on the flip chip memory module such as a SIMM or DIMM board. The die package also provides superior signal integrity.

The configuration of the RDL with traces connecting bond pads of two or more dies together and routing the connection to a single ball pad also eliminates the need for a separate pin or ball contact for each individual bond pad, resulting in a lower pin count compared to other memory module chip units. The package also is easier to lay out on a DIMM board or other memory module since part of the routing is done on a wafer level.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIG. 3 is a plan view of the wafer level package of FIG. 2, without an insulating layer.

FIG. 4 is a cross-sectional, side elevational view of the wafer level package of FIG. 3, taken along line 4-4.

FIG. 12 is a plan view of a processing step in which an insulating layer, shown as partially cut away, is applied over the RDL of the package depicted in FIG. 3, and openings are formed to the bond pads and ball pads.

FIG. 13 is a cross-sectional, side elevational view of the wafer level package of FIG. 12, taken along line 13-13.

FIG. 14 is a plan view of a subsequent processing step in which a second redistribution layer (RDL) is fabricated on the insulating layer, shown as partially cut away.

FIG. 15 is a cross-sectional, side elevational view of the wafer level package of FIG. 14, taken along line 15-15.

FIG. 16 is a plan view of a subsequent processing step in which an insulating layer is applied over the second RDL of the package depicted in FIG. 14, with ball contacts mounted on the ball pads of the dies.

FIG. 17 is a cross-sectional, side elevational view of the wafer level package of FIG. 16, taken along line 17-17.

FIGS. 19-27 illustrate sequential processing steps in the fabrication of another embodiment of a wafer level package according to the invention.

FIG. 19 is a plan view of a processing step in which a redistribution layer (RDL) is formed to connect bond pads of the dies of the package.

FIG. 20 is a cross-sectional, side elevational view of the wafer level package of FIG. 19, taken along line 20-20.

FIG. 21 is a plan view of a subsequent processing step in which an insulating layer, shown as partially cut away, is applied over the RDL of the package depicted in FIG. 19, and openings are formed to the bond pads of the dies.

FIG. 22 is a cross-sectional, side elevational view of the wafer level package of FIG. 21, taken along line 22-22.

FIG. 23 is a plan view of a subsequent processing step in which a second redistribution layer (RDL) is fabricated on the insulating layer, shown as partially cut away.

FIG. 24 is a cross-sectional, side elevational view of the wafer level package of FIG. 23, taken along line 24-24.

FIG. 25 is a partial view of the package of FIG. 23, showing a schematic depiction of trace connections of bond pads of the dies, with traces of the first RDL shown as broken lines.

FIG. 26 is a plan view of a subsequent processing step in which an insulating layer is applied over the second RDL of the package depicted in FIG. 24, with ball contacts mounted on the ball pads of the dies.

FIG. 27 is a cross-sectional, side elevational view of the wafer level package of FIG. 26, taken along line 27-27.

FIG. 28 is a plan view of a processing step in which a first redistribution layer (RDL) is formed to connect bond pads of the dies of the package.

FIG. 29 is a cross-sectional, side elevational view of the wafer level package of FIG. 28, taken along line 29-29.

FIG. 30 is a plan view of a subsequent processing step in which a first insulating layer, shown as partially cut away, is applied over the first RDL of the package depicted in FIG. 28, and openings are formed to the interconnecting traces.

FIG. 31 is a cross-sectional, side elevational view of the wafer level package of FIG. 30, taken along line 31-31.

FIG. 32 is a plan view of a subsequent processing step in which a second insulating layer, shown as partially cut away, is applied over the first insulating layer of the package depicted in FIG. 30, with openings formed to the interconnecting traces, and a second redistribution layer (RDL) is fabricated on the second insulating layer to provide via interconnects to the interconnecting traces within the openings, and ball pads and traces connecting the via interconnects to the ball pads.

FIG. 33 is a cross-sectional, side elevational view of the wafer level package of FIG. 32, taken along line 33-33.

FIG. 34 is a cross-sectional, side elevational view of the wafer level package of FIG. 32, taken along line 34-34.

FIG. 35 is a plan view of a subsequent processing step in which an insulating layer, shown as partially cut away, is applied over the second RDL of the package depicted in FIG. 32, with openings formed to the ball pads, and ball contacts mounted on the ball pads of the dies.

FIG. 36 is a cross-sectional, side elevational view of the wafer level package of FIG. 35, taken along line 36-36.

DETAILED DESCRIPTION OF THE PREFERRED EMBODIMENT

Figure 1:
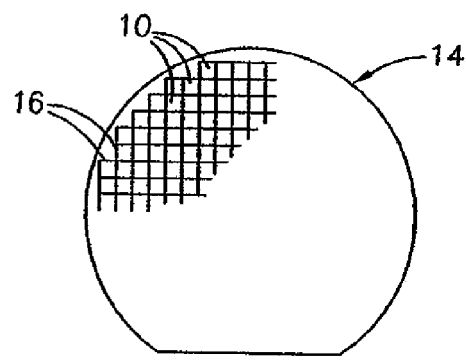
FIG. 1 is a plan view of a substrate containing wafer level packages according to the invention.

The invention will be described generally with reference to the drawings for the purpose of illustrating embodiments only and not for purposes of limiting the same. The figures illustrate processing steps for use in fabricating semiconductor devices in accordance with the present invention. It should be readily apparent that the processing steps are only a portion of the entire fabrication process.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

The present invention provides a semiconductor die package comprising two or more dies that can be fabricated at the wafer level, that is, an entire wafer of active device dies can be processed according to the invention to form one or more die packages, and burn-in and testing of the one or more packages can be performed before the wafer is separated into individual packages. It is also contemplated that packages can be defined as comprising, multiple, unseparated packages containing two or more dies, or whole or partial wafers.

Referring to FIGS. 1-4, a first embodiment of an integrated wafer level package 10 according to the invention is depicted. The wafer level package 10 comprises two or more semiconductor dies. For illustrative purposes, each package 10 includes four dies 12a-12d (delineated by the dashed lines), which is merely exemplary.

The dies are fabricated on a surface of a substrate 14, typically a semiconductor wafer, through etching, deposition, or other well known techniques, and contain integrated circuitry comprising active devices to perform a specific memory function. A dynamic random access memory circuit is exemplary of such an integrated circuit, although other circuits for any function, such as processors, can be packaged according to the invention. Scribe lines 16 are typically provided between the wafer level packages 10. The active surface 18 of the dies 12a-12d includes a series of bond pads 20a-20d in electrical communication with the integrated circuits contained within each die 12a-12d. In the illustrated example, the bond pads 20a-20d are in a linear pattern in a longitudinal arrangement on each of the dies, although other bond pad arrangements can be utilized. A passivation or insulating (dielectric) film 22 has been formed over the surface of the wafer 14 to passivate the active surface of the dies and to seal the device structures of the dies from contamination and moisture, and as a scratch protection layer. Openings formed in the insulating film align with and expose the bond 20a-20d pads of the dies.

The wafer level package 10 further includes a redistribution layer (RDL) 24 formed on the insulating film 22. The RDL 24 includes electrically conductive traces 26 that connect the bond pads 20a-20d of the dies to ball pads 28 for attaching external ball contacts 30 such as solder balls.

Figure 5:
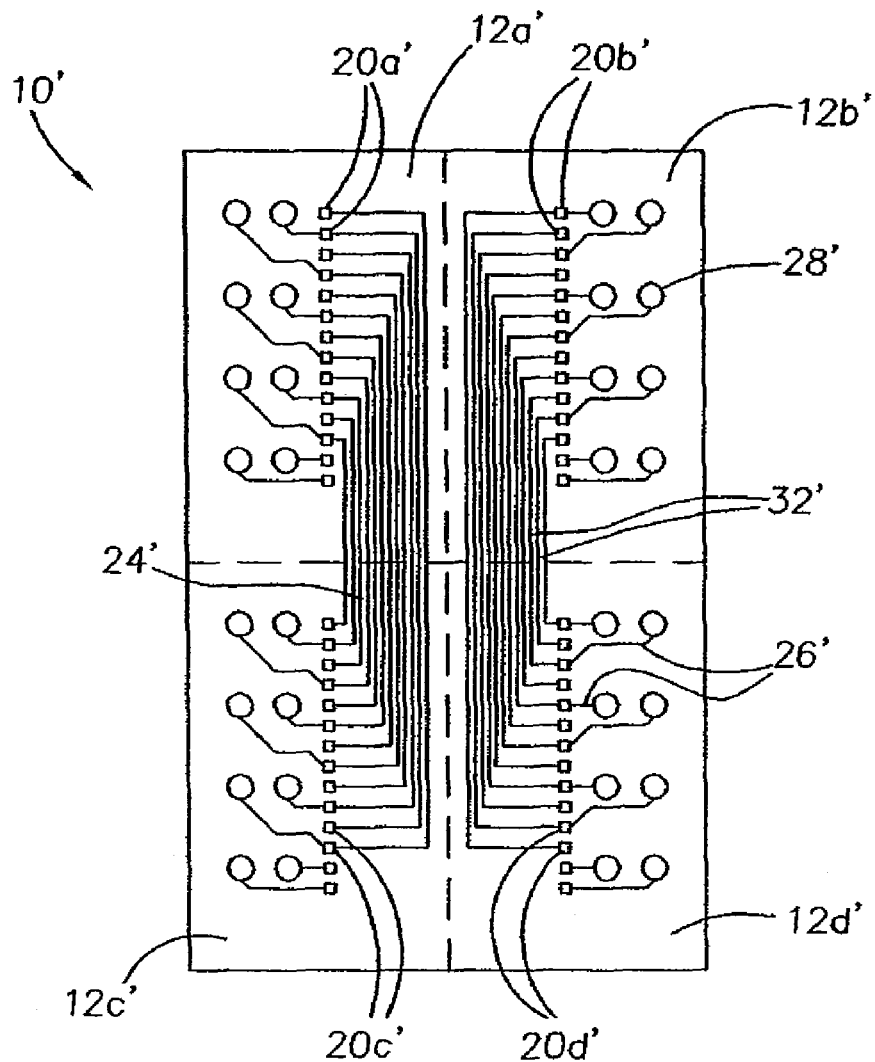
FIG. 5 is a plan view of another embodiment of a wafer level package according to the invention.

According to the invention, the RDL 24 of the wafer level package 10 also includes traces 32 that interconnect the bond pads of two or more of the dies within the wafer level package. For example, as illustrated in FIG. 3, in the embodiment of the wafer level package 10, the traces 32 of the RDL are formed to interconnect the bond pads 20a of a first die 12a to the bond pads 20b of a second die 12b, and the bond pads 20c of a third die 12c to the bond pads 20d of a fourth die 12d. Referring to FIG. 5, in another embodiment of a wafer level package 10' according to the invention, the traces 32' of the RDL 24' are patterned to interconnect the bond pads 20a' of a first die 12a' with the bond pads 20c' of a third die 12c', and the bond pads 20b' of a second die 12b' with the bond pads 20d' of a fourth die 12d'. The illustrated trace interconnections are merely exemplary, and other configurations of the trace interconnections 32 can be utilized to interconnect the bond pads of the dies to each other and to the ball pads within the wafer level package.

Figure 6:
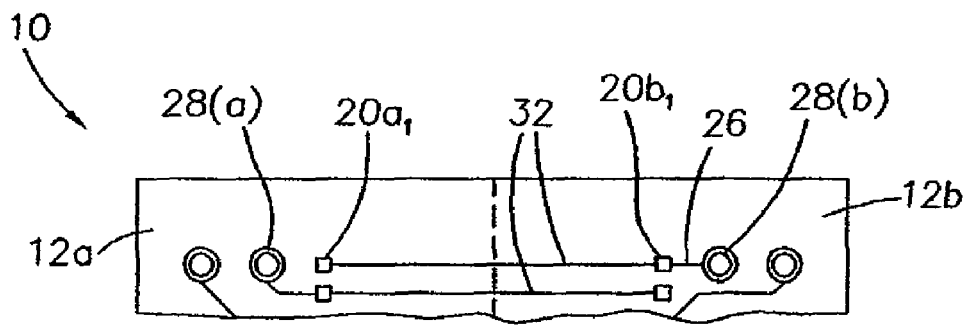
FIG. 6 is a partial view of the wafer level package of FIG. 3, showing a portion of the redistribution layer.

Each bond pad of a die within the wafer level package is connected to a ball pad 28 either directly through a trace 26, or indirectly through the interconnecting trace 32 leading to the bond pad of the adjoining die, which is then connected through the trace 26 to the ball pad 28. For example, referring to FIG. 6, the bond pad $20b_1$ of die 12b is directly connected to the ball pad 28(b) via the trace 26. As further shown, the bond pad $20a_1$ of die 12a is also connected to the same ball pad 28(b) indirectly through the interconnecting trace 32 and the trace 26 leading from the bond pad $20b_1$ of die 12b.

Figure 2:
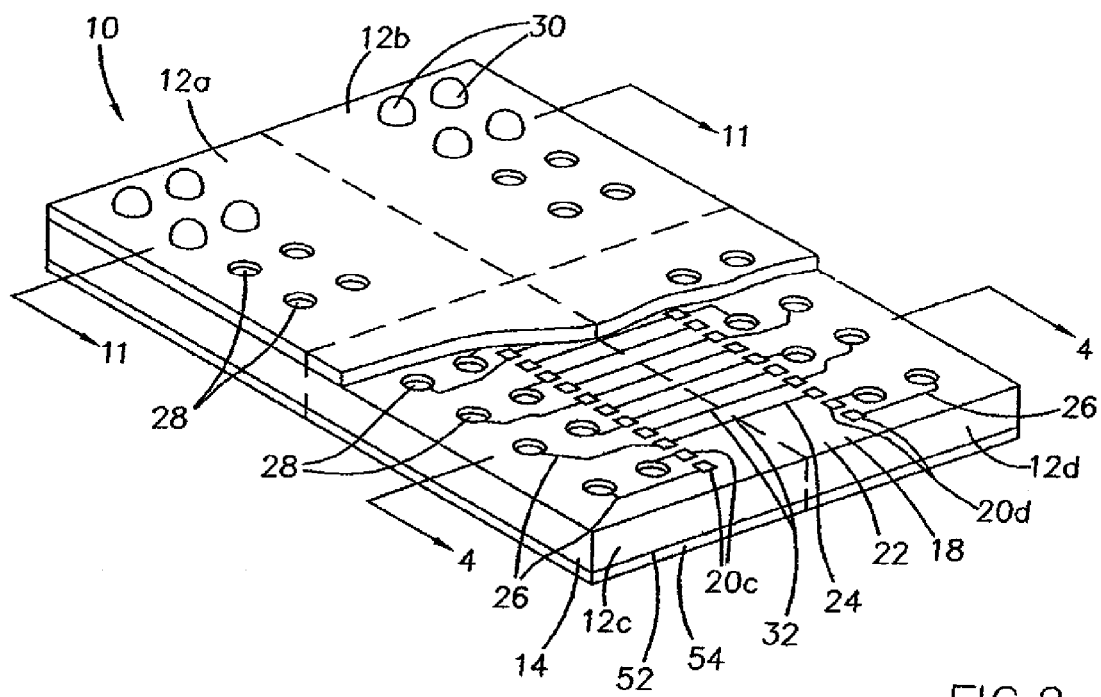
FIG. 2 is a perspective view of an embodiment of a wafer level package according to the invention, showing an insulating layer partially cut away to expose a redistribution layer.
Figure 7:
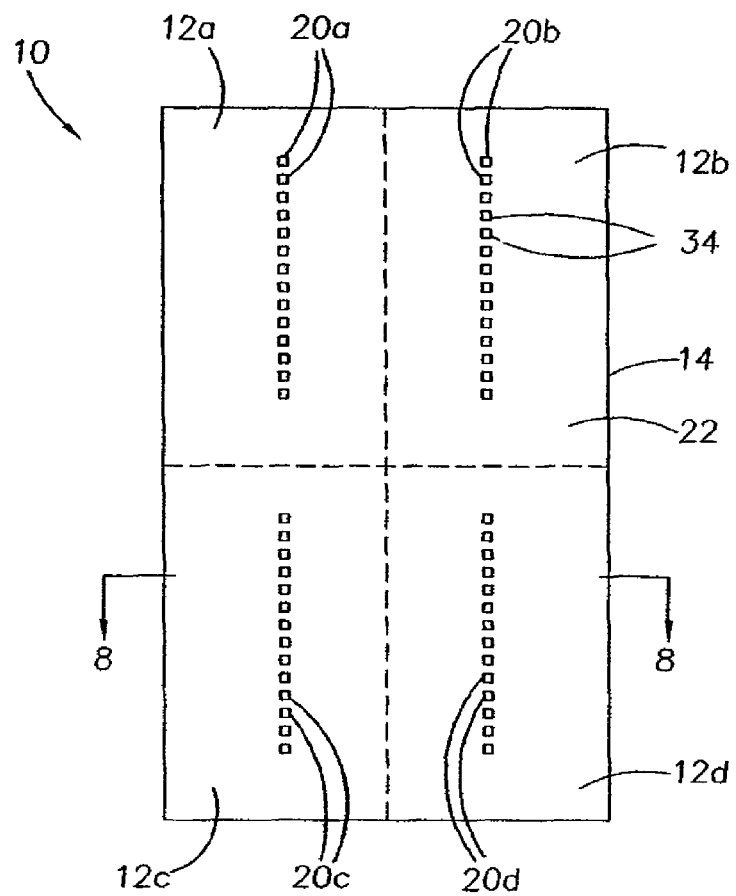
FIG. 7 is a plan view of a processing step in the fabrication of the wafer level package of FIG. 2, according to an embodiment of a method of the invention showing the bond pads exposed through openings in the insulating film.

Referring now to FIG. 7, a processing step is illustrated in an embodiment of a method for forming the wafer level package 10 of FIG. 2, which comprises four dies 12a-12d. The semiconductor dies 12a-12d are formed on a semiconductor wafer or other substrate 14, through etching, deposition, or other well known techniques in the art, and respectively include bond pads 20a-20d. The bond pads 20a-20d typically comprise a conductive metal or metal alloy such as aluminum, aluminum alloy, titanium, tungsten, titanium-tungsten alloy, tantalum, platinum, copper, or refractory metal silicide, for example, and are electrically connected to the die circuitry.

Figure 8:
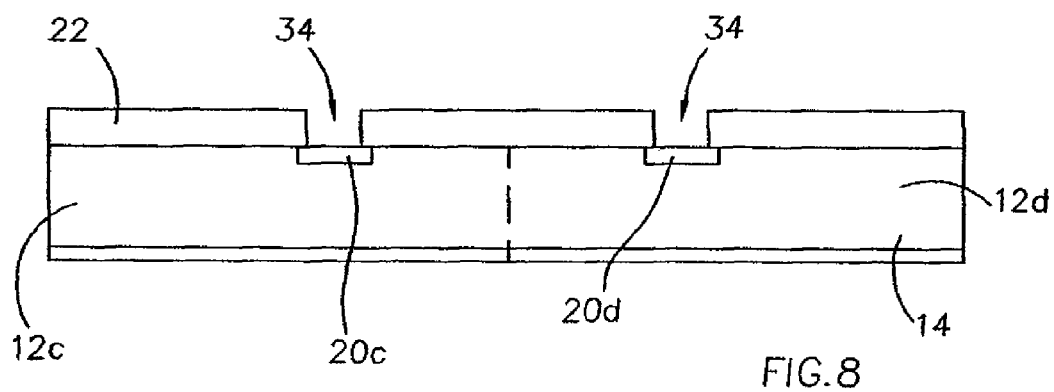
FIG. 8 is a cross-sectional view of the package of FIG. 7, taken along line 8-8.

As also shown in FIG. 8, an insulating film 22 can be formed over the surface of the substrate 14 to passivate the active surface of the dies, as known in the art, typically by oxidizing or nitriding to form a silicon dioxide or silicon nitride layer or a combination of the two. The insulating film 22 can also be formed of a dielectric material such as polyimide or another non-conductive elastomer, a photoimageable polymer such as benzocyclobutene (BCB), or a spin on glass (SOG) such as phosphosilicate glass (PSG), borosilicate glass (BSG) and borophosphosilicate glass (BPSG), among other insulating materials. The material can be applied using conventional methods including deposition techniques, spin coating, spraying, flow coating, brush coating, among other application techniques. The insulating film 22 can be masked and etched by conventional methods to form openings 34 that align with and expose the bond pads 20a-20d of the dies 12a-12d.

As illustrated in FIGS. 3-4, a redistribution layer (RDL) 24 is formed on the insulating film 22, which includes traces 26, ball pads 28, and interconnecting traces 32.

The present invention utilizes a conductive redistribution wafer level package technology on two or more chips whereby, instead of the redistribution traces confined to a single chip (unit), the routing traces are extended to one or more adjacent chips (units) with all common signal buses being tied together. The structure of the redistribution layer to interconnect two or more dies within a package increases the memory capacity of the die package. For example, where redistribution traces interconnect two die units, the memory capacity of the combined units is double. This capacity can be extended to additional multiple units, for example, four units, eight units, sixteen units, and so on. The present invention thus results in an increase in the capacity of a singulated unit or die package as a wafer scale (level) package. Further, since address, data and some control buses or even power/ground pins for memory devices are shared, the number of pin-out/contact balls for the integrated package is reduced compared to single die units.

The RDL 24 typically comprises a highly conductive metal or metal alloy such as copper, aluminum, gold, and nickel, for example, or a conductive polymer material. The RDL 24 can be formed using known techniques in the art such as chemical vapor deposition (CVD), plasma enhanced chemical vapor deposition (PECVD), physical vapor deposition (PVD) (sputtering or evaporation), electroplating, electroless plating, stenciling, and screen printing, for example. The RDL 24 can comprise, for example, a foil tape of copper, aluminum or other suitable metal, that can be stamp-cut to provide the desired pattern of traces and ball pads.

Figure 9:
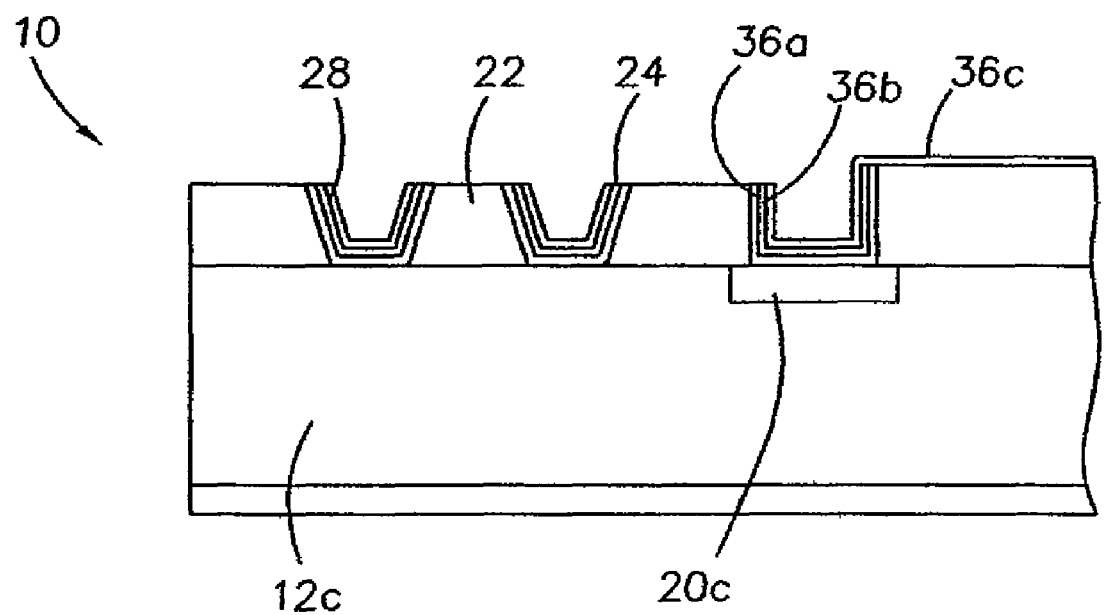
FIG. 9 is a partial cross-sectional view of the wafer level package of FIG. 4, showing an embodiment of a multi-layered RDL.

The RDL can also comprise a multiple metal layers applied over the insulating film 22 according to known techniques, to form a sandwich or multi-layer under-bump metallurgy (UBM) structure, typically having a tri-metal layer structure. As depicted in FIG. 9, for example, the multiple metal layer RDL 24 can comprise overlying layers 36a-36c of a conductive material such as overlying layers of aluminum, nickel, and copper, or overlying layers of chromium, chromium/copper, and copper, for example. Ideally, in utilizing a tri-metal layer structure, the third metal layer 36c is extended to route traces over adjacent units.

Figure 10:
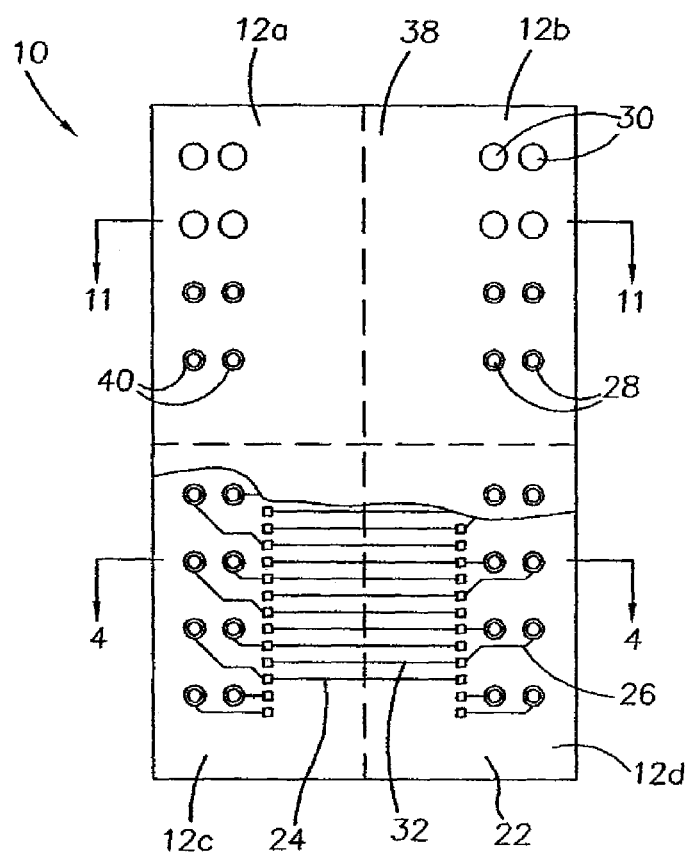
FIG. 10 is a plan view of a processing step in the fabrication of the wafer level package of FIG. 2, in which an insulating layer, shown as partially cut away, is applied over the RDL layer, and ball contacts are mounted on the ball pads.
Figure 11:
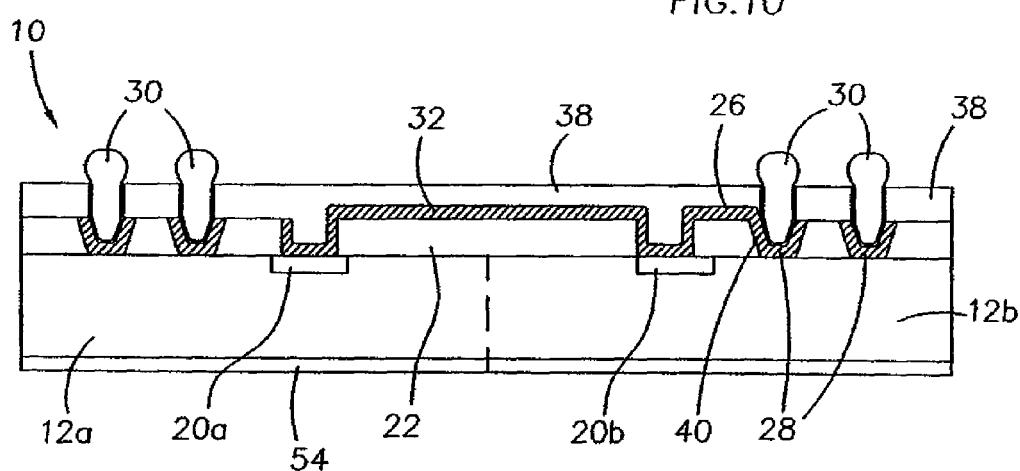
FIG. 11 is a cross-sectional view of the package of FIG. 10, taken along line 11-11.

As shown in FIGS. 10-11, an insulating layer 38 is then applied over the RDL 24 to form a passive exterior layer over the traces 26, 32. The insulating layer 38 can comprise, for example, a polymeric material such as polyimide or another non-conductive elastomer, or a photoimageable polymer such as benzocyclobutene (BCB). The material can be applied using conventional methods, and the insulating layer 38 can be patterned and etched according to known techniques to provide openings 40 that align with and expose the ball pads 28.

A plurality of ball contacts 30 are attached to the ball pads 28 for connecting the wafer level package 10 as a component to an external circuit board, motherboard or other electrical apparatus or device. Exemplary ball contacts 30 comprise solder typically comprising tin (Sn) and/or lead (Pb), or a conductive material such as a conductive epoxy or conductor-filled epoxy. Solder ball contacts 30 can be formed using conventional processes such as stenciling, screen printing, electroplating, electroless plating, evaporation, and the like. Conductive polymer material can be applied and cured to form the ball contacts.

The wafer can then singulated along scribe lines 16 into individual packages 10, each of which include at least two dies, and shown as four interconnected dies 12a-12d in the illustrated example.

Figure 12:
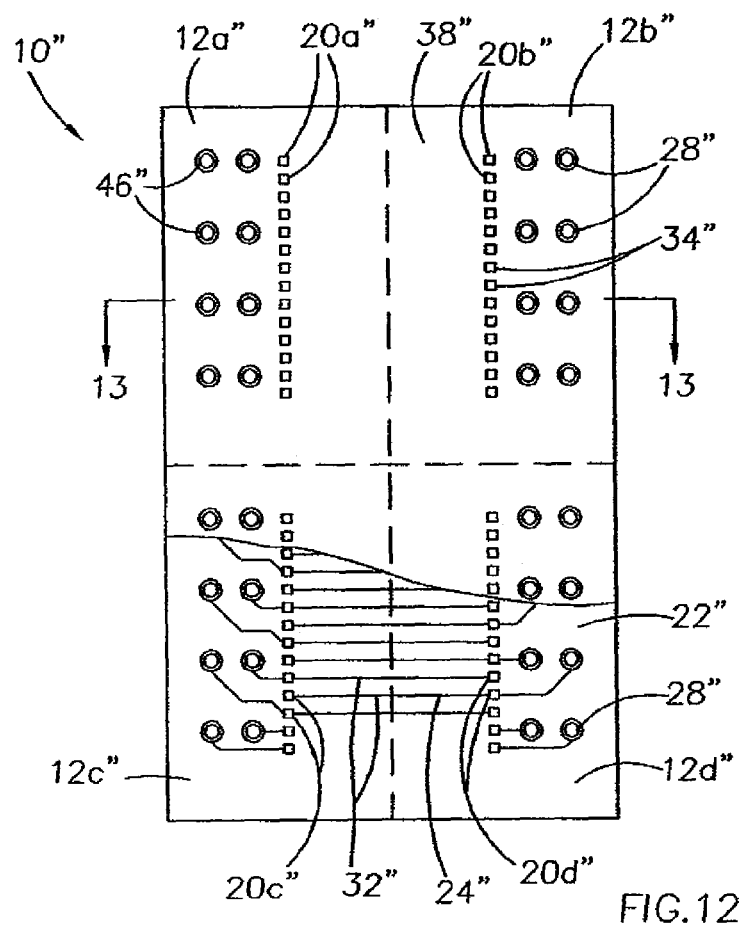
FIGS. 12-17 illustrate sequential processing steps in the fabrication of another embodiment of a wafer level package according to the invention.
Figure 13:
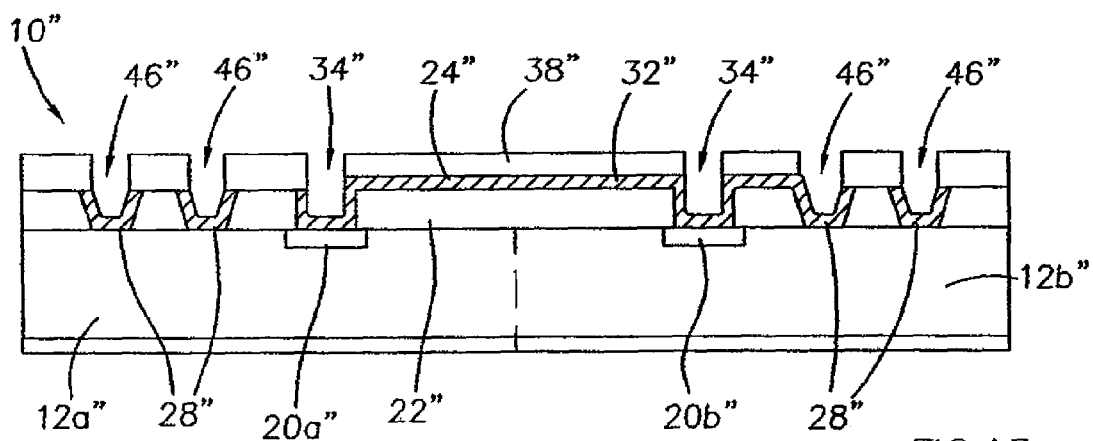
Figure 14:
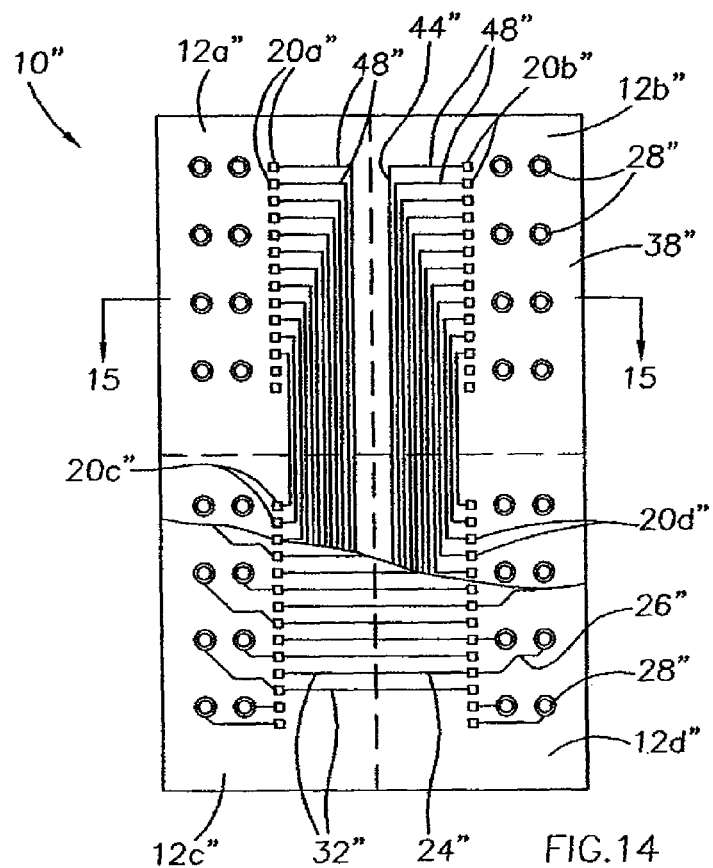
Figure 15:
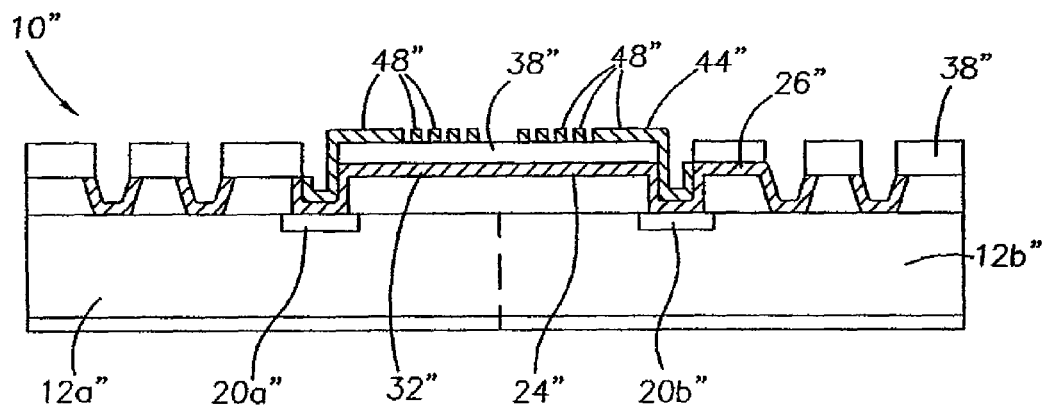
Figure 16:
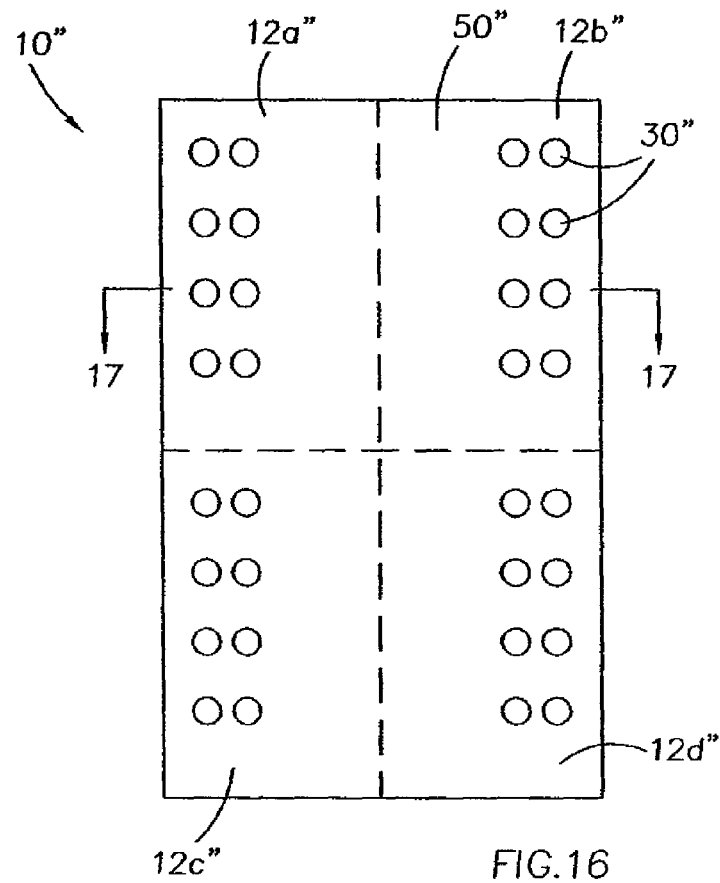
Figure 17:
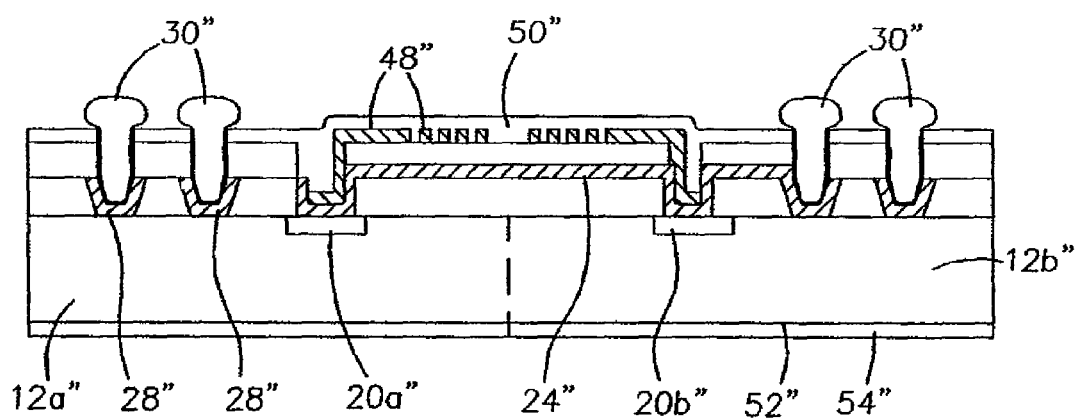

In another embodiment of a wafer level package 10" according to the invention, the package can be fabricated with one or more overlying RDLs to interconnect additional dies within a package, as depicted in FIGS. 12-17. By way of example, an initial RDL layer 24" comprising traces 32" interconnecting the bond pads 20a" to 20b" of the first and second dies 12a", 12b", and the bond pads 20c" to 20d" of the third and fourth dies 12c", 12d" can be fabricated as described with respect to the wafer level package 10 of FIG. 3. As illustrated in FIGS. 12-13, openings 34", 46" are formed through the insulating layer 38", respectively to align with and expose the bond pads 20a"-20d" and ball pads 28" of the initial RDL 24". As depicted in FIGS. 14-15, a second RDL 44" can then be applied onto the insulating layer 38", with traces 48" interconnecting the bond pads 20a" to 20c" of the first and third dies 12a", 12c", and the bond pads 20b" to 20d" of the second and fourth dies 12b", 12d", for example. Thus, all dies 12a"-12d" of the wafer level package 10" are interconnected by means of the interconnecting traces 32", 48" of the first and second RDLs 24", 44". As depicted in FIGS. 16-17, an insulating layer 50" can then be applied over the RDL 44" to form a passive exterior layer, with openings provided to the balls pads 28", and ball contacts 30" can be connected to the ball pads 28".

Figure 18:
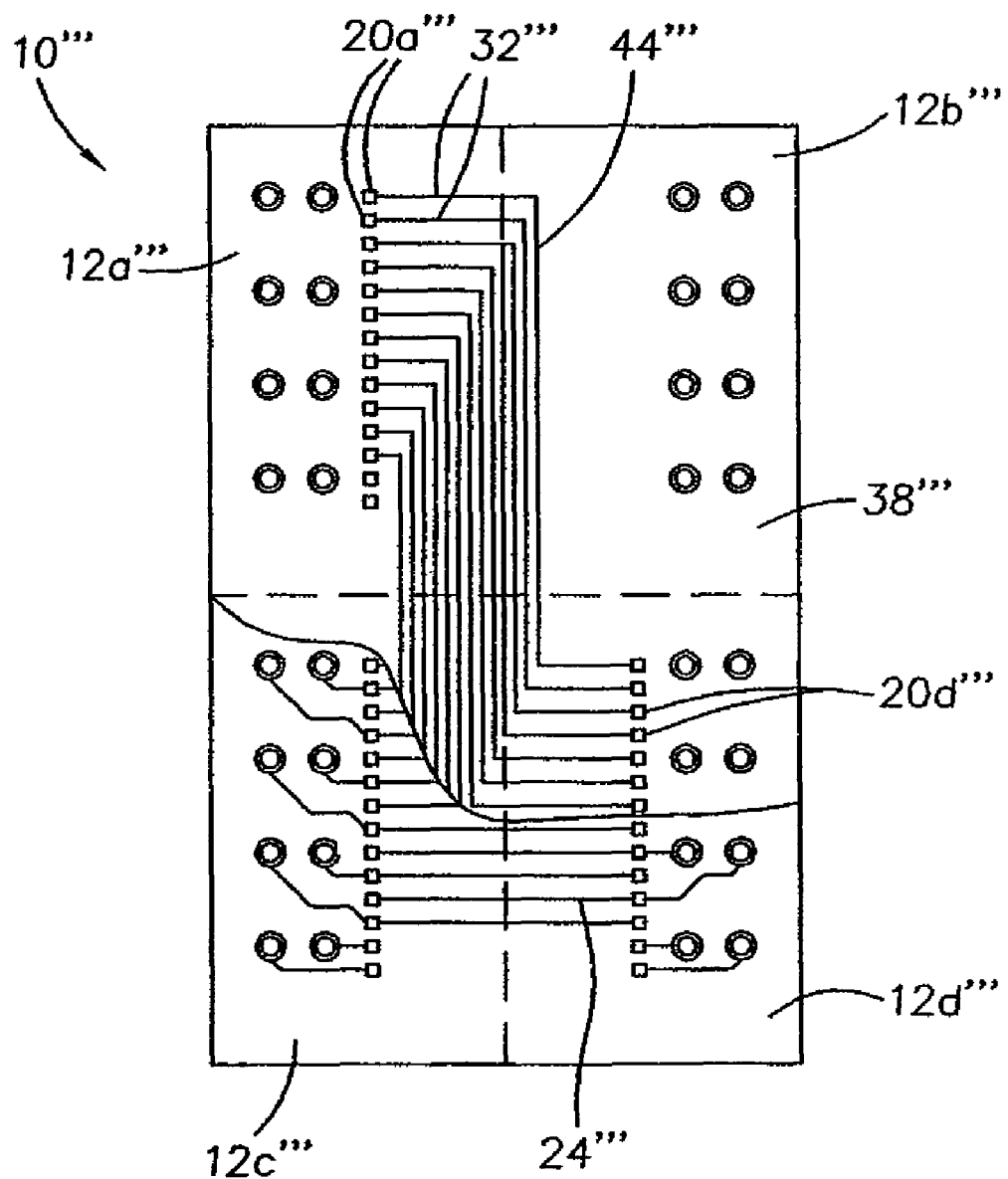
FIG. 18 is a plan view of another embodiment of a wafer level package according to the invention, having a second redistribution layer disposed on a partially cut-away insulating layer overlying a first distribution layer.

Another example of a configuration of a second RDL 44" is illustrated in FIG. 18. In the illustrated embodiment of a wafer level package 10'", the initial RDL 24'" is configured similar to the RDL 24 shown in FIG. 3. The second RDL 44'" has been fabricated on the insulating layer 38'" such that the traces 32'" interconnect the bond pads 12a'" to the bond pads 12d'" of the first and fourth dies 12a'", 12d'", resulting in the interconnection of all four dies 12a'"-12d'" within the package 10'". Other configurations of two or more RDLs can be utilized to interconnect two or more dies within a wafer level package.

Figure 21:
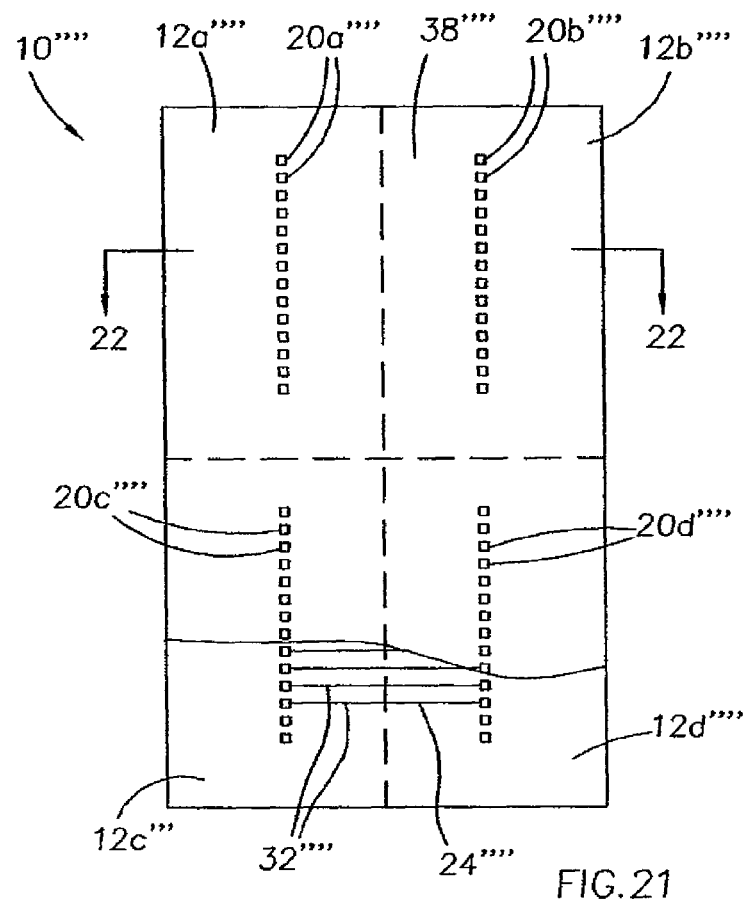
Figure 22:
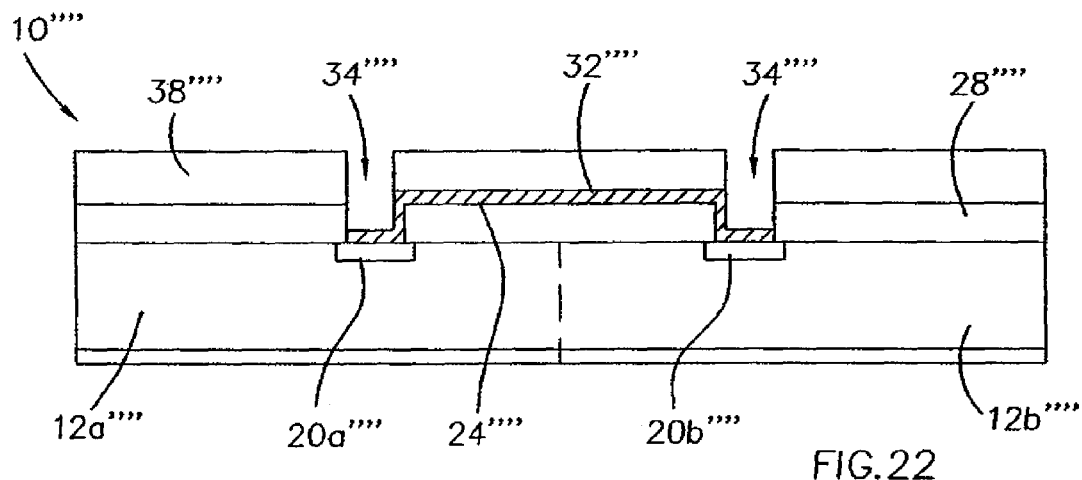
Figure 23:
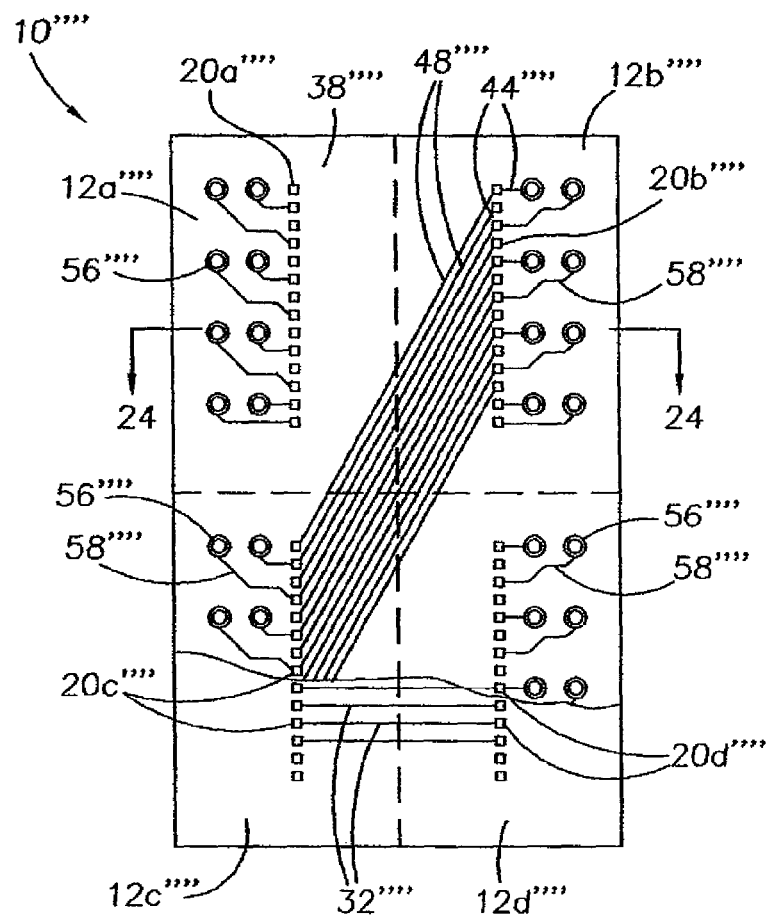
Figure 24:
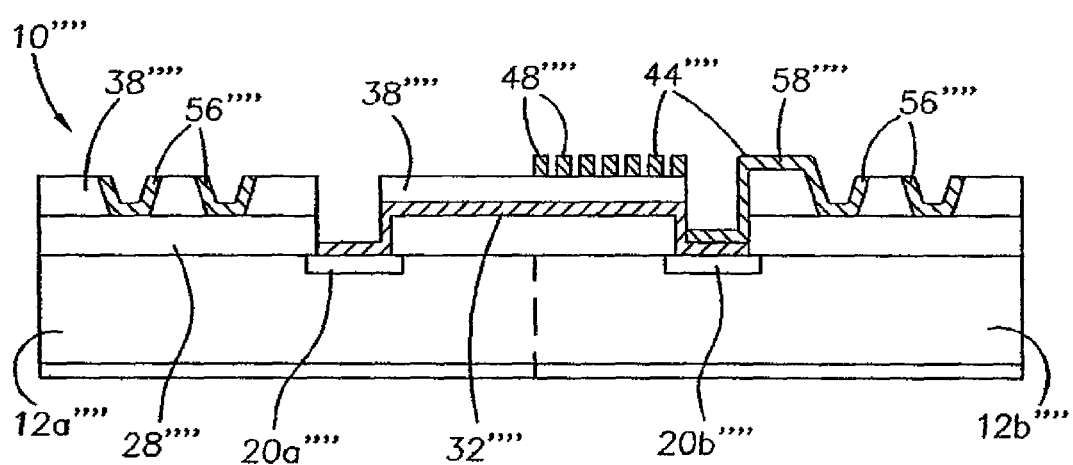

In yet another embodiment of an integrated wafer level package 10"" according to the invention, the package can comprise two or more redistribution layers (RDLs) whereby the ball pads are fabricated as part of the second (or subsequent) RDL. As depicted in FIGS. 19-20, a first RDL 24"" is fabricated on a insulating film 28"". As shown, the RDL 24"" comprises traces 32"" interconnecting the bond pads 20a"" to 20b"" of the first and second dies 12a"", 12b"", and the bond pads 20c"" to 20d"" of the third and fourth dies 12c"", 12d"". An insulating layer 38"" can be applied over the RDL 24"", and openings 34"" formed through the layer to align with and expose the bond pads 20a""-20d"", as illustrated in FIG. 21-22. As shown in FIGS. 23-24, a second RDL 44"" can then be formed on the insulating layer 38"". The RDL 44"" can comprise traces 48"" interconnecting the bond pads of two dies in the packages, illustrated as connecting bond pads 20b"" to 20c"" of the second and third dies 12b"", 12c"", for example. Other trace connections 48"" can be provided as illustrated, for example, in FIGS. 14 and 18.

Figure 25:
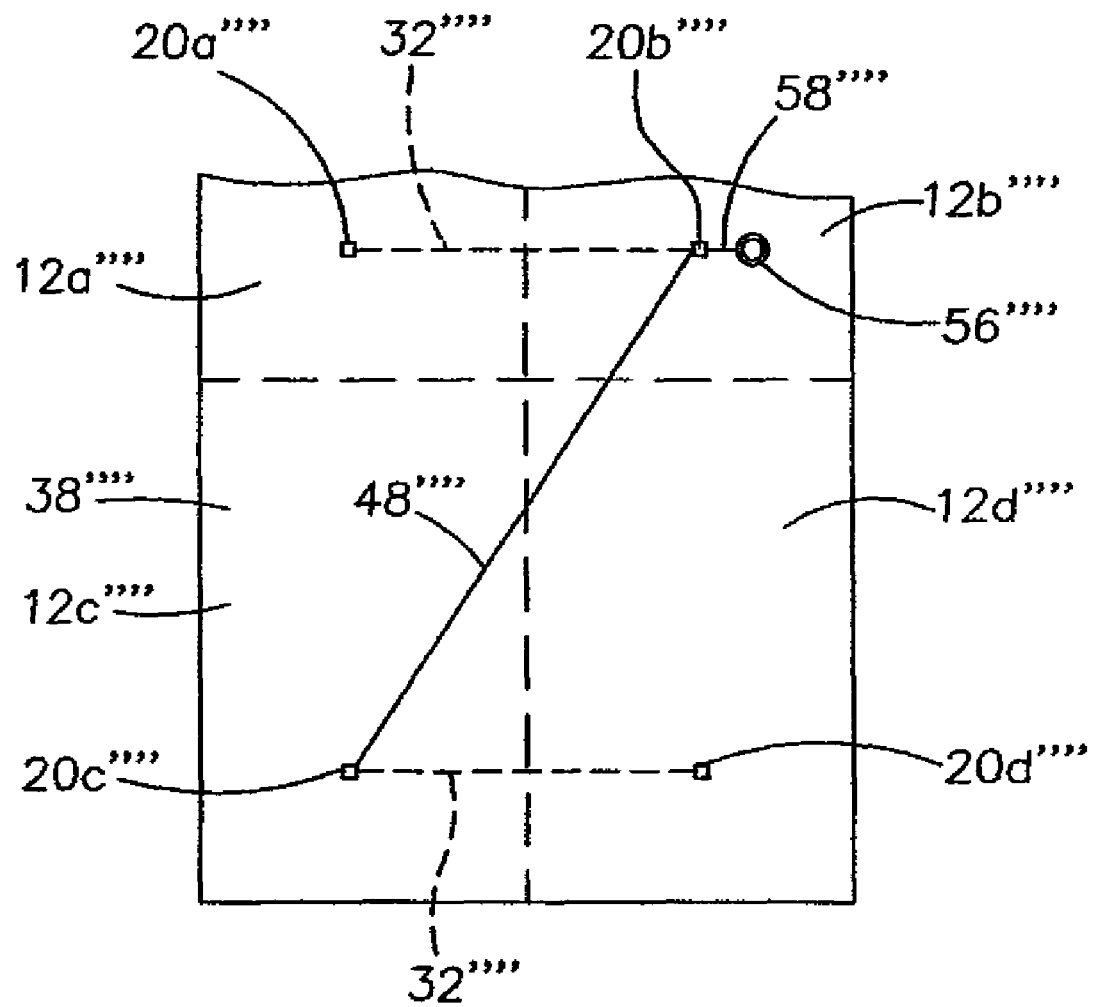
Figure 26:
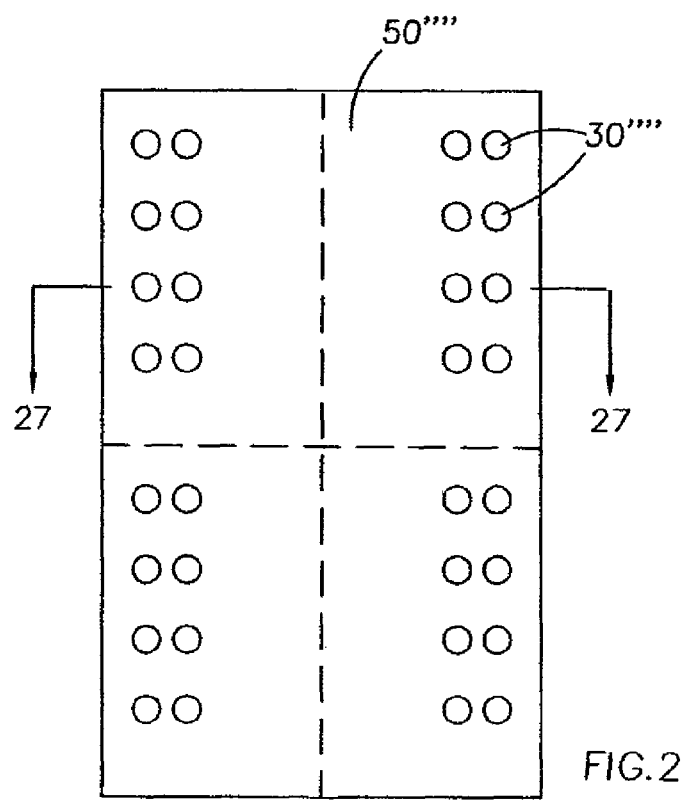
Figure 27:
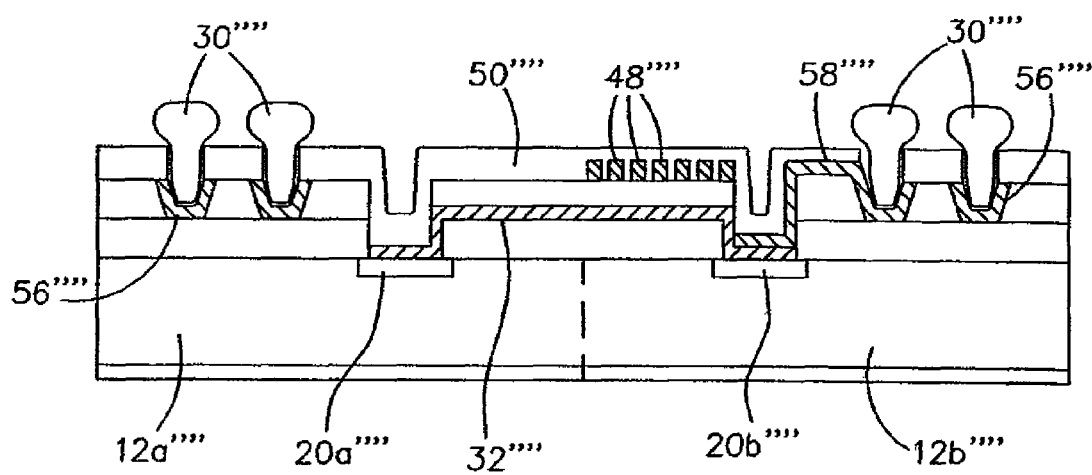
Figure 28:
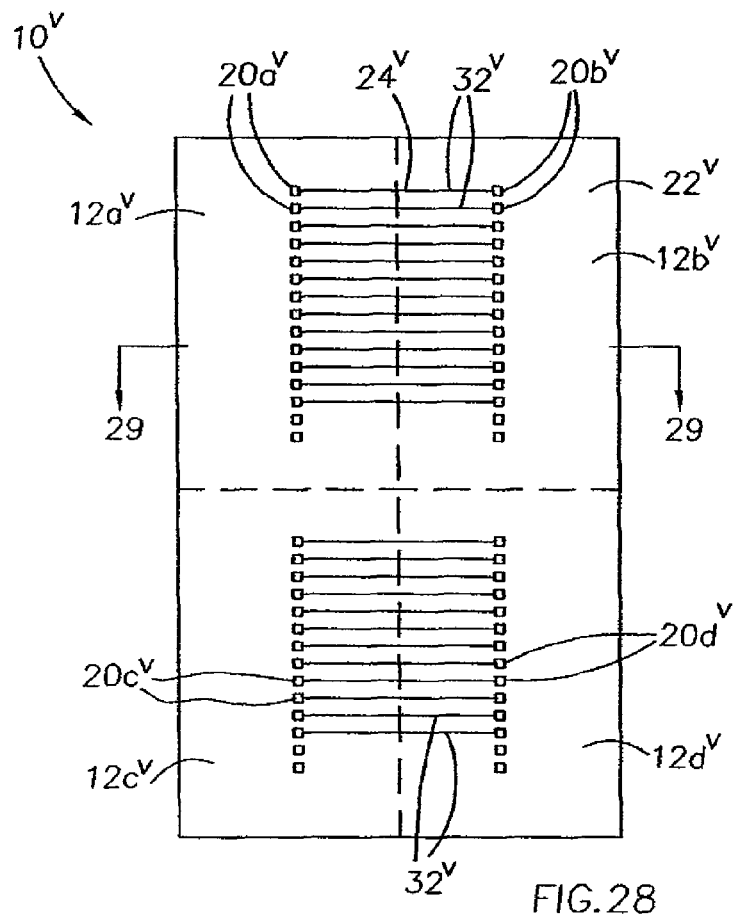
FIGS. 28-36 illustrate sequential processing steps in the fabrication of another embodiment of a wafer level package according to the invention.
Figure 29:
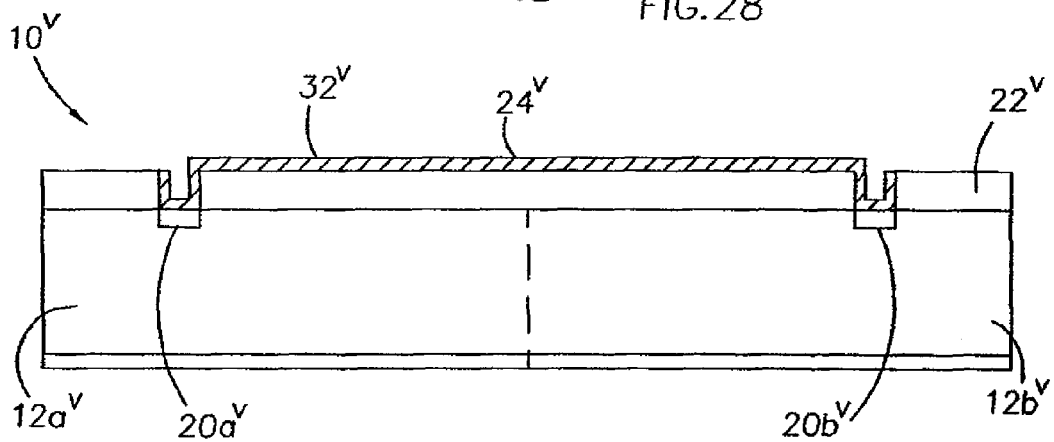

RDL 44"" further comprises ball pads 56"" that are connected through traces 58"" to bond pads 20a""-20d"" of the dies. As in the other wafer level packages, each bond pad of a die communicates with a ball pad 56"" either directly through a trace 58"", or indirectly through the interconnecting trace 32"" and/or 48"" leading to the bond pad of the adjoining die, which is then connected through the trace 58"" to the ball pad 56"". As depicted in FIG. 25, for example, trace 58"" directly connects bond pad 20b"" to the ball pad 56""; and traces 32"", 48"" and/or 58"" indirectly connect bonds pads 20a"", 20c"", and 20d"" to the same ball pad 56"". This results in dies 12a""-12d"" of package 10"" being interconnected to the same ball pad 56"". As depicted in FIGS. 26-27, an insulating layer 50"" can then be applied over the RDL 44"" to form a passive exterior layer, with openings to the ball pads 56"". Ball contacts 30"" can then be connected to the ball pads 56"".

Figure 30:
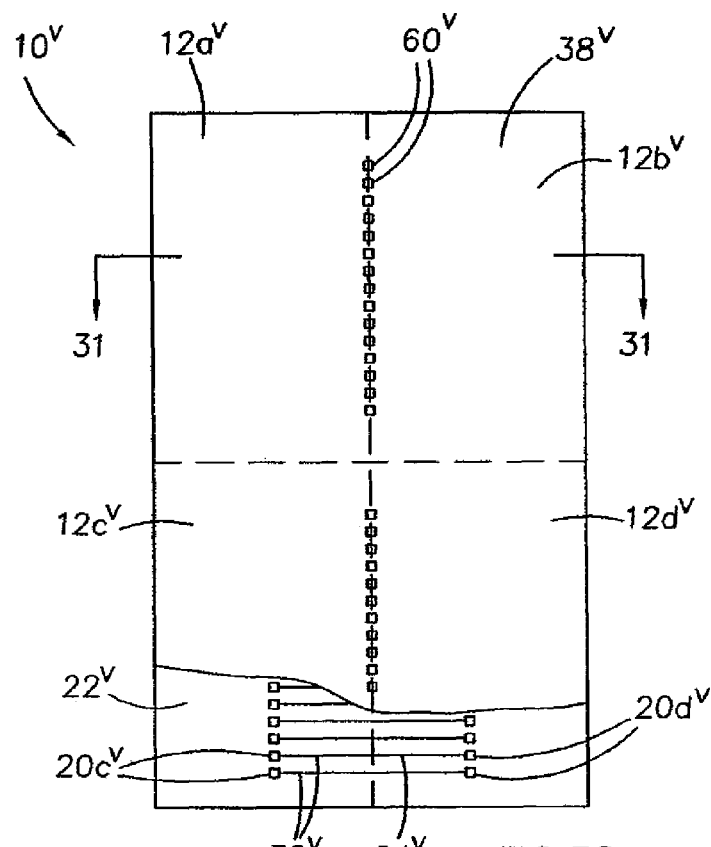
Figure 31:
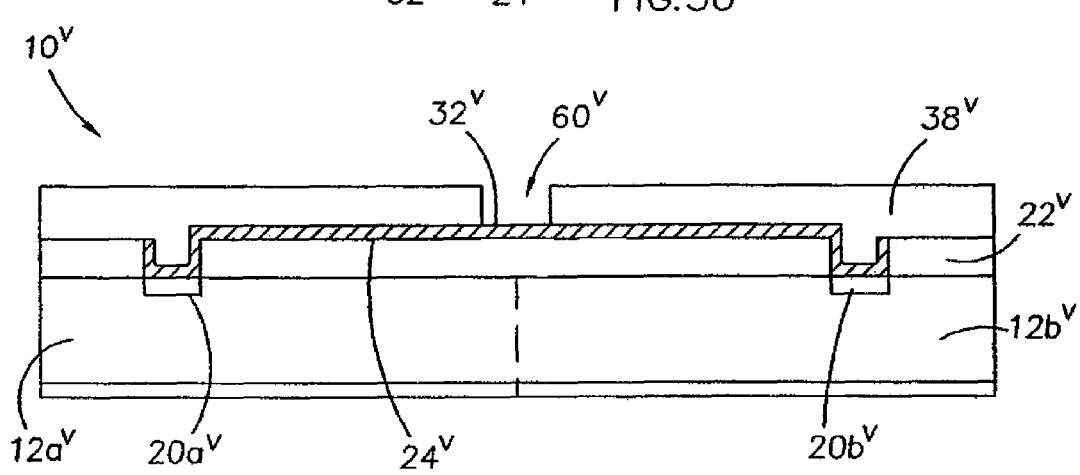

Another embodiment of a wafer level package $10^v$ according to the invention is depicted in FIGS. 28-36. As illustrated, in FIGS. 28-29, initial RDL layer $24^v$ is fabricated on an insulating film $22^v$ disposed over the dies on the wafer surface, and includes traces $32^v$ interconnecting the bond pads $20a^v$ to $20b^v$ of the first and second dies $12a^v$, $12b^v$, and the bond pads $20c^v$ to $20d^v$ of the third and fourth dies $12c^v$, $12d^v$. As shown in FIGS. 30-31, an insulating layer $38^v$ is then applied over the RDL $24^v$ to form a passive layer over the interconnecting traces 32', with openings $60^v$ formed between adjoining dies $12a^v$, $12b^v$ and $12c^v$, $12d^v$ to expose the interconnecting traces $32^v$.

Figure 32:
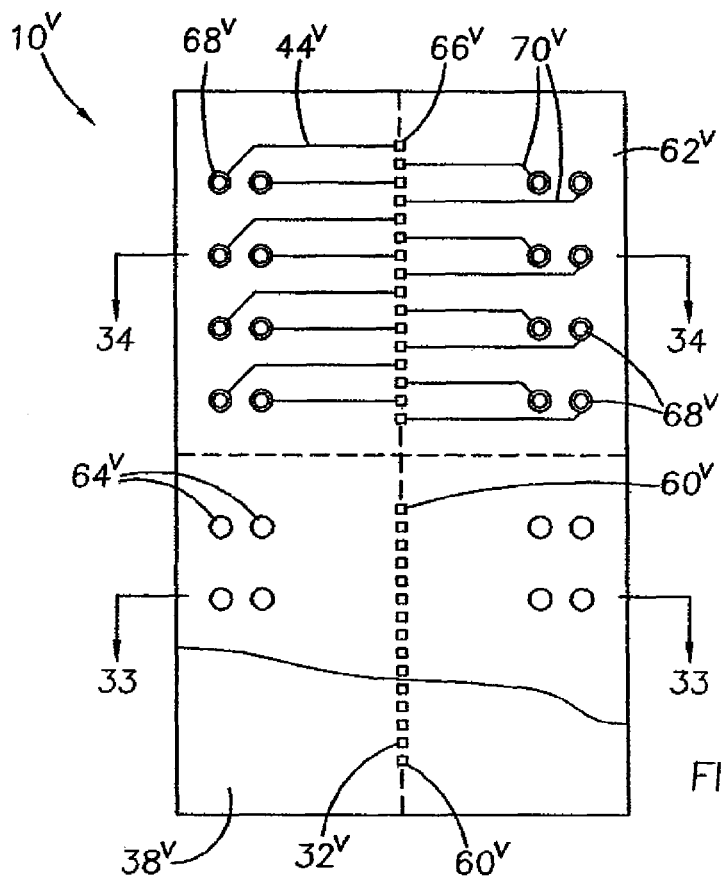
Figure 33:
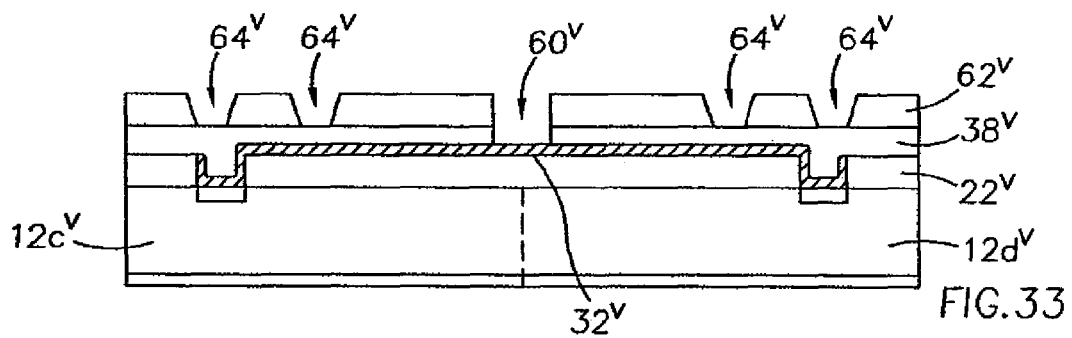
Figure 34:
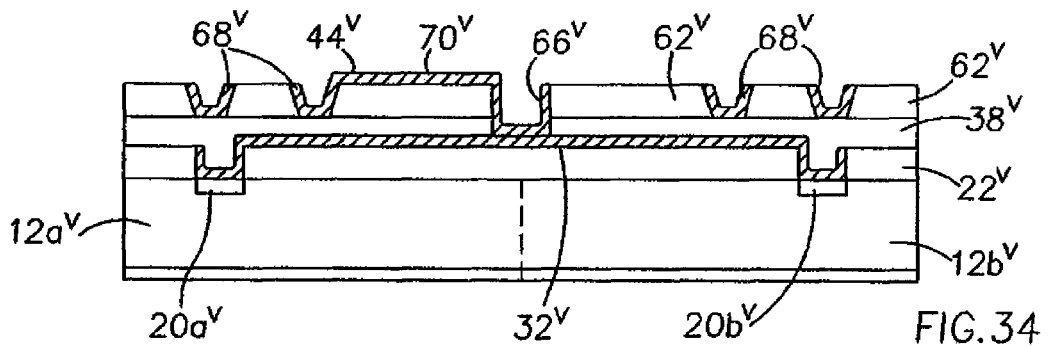
Figure 35:
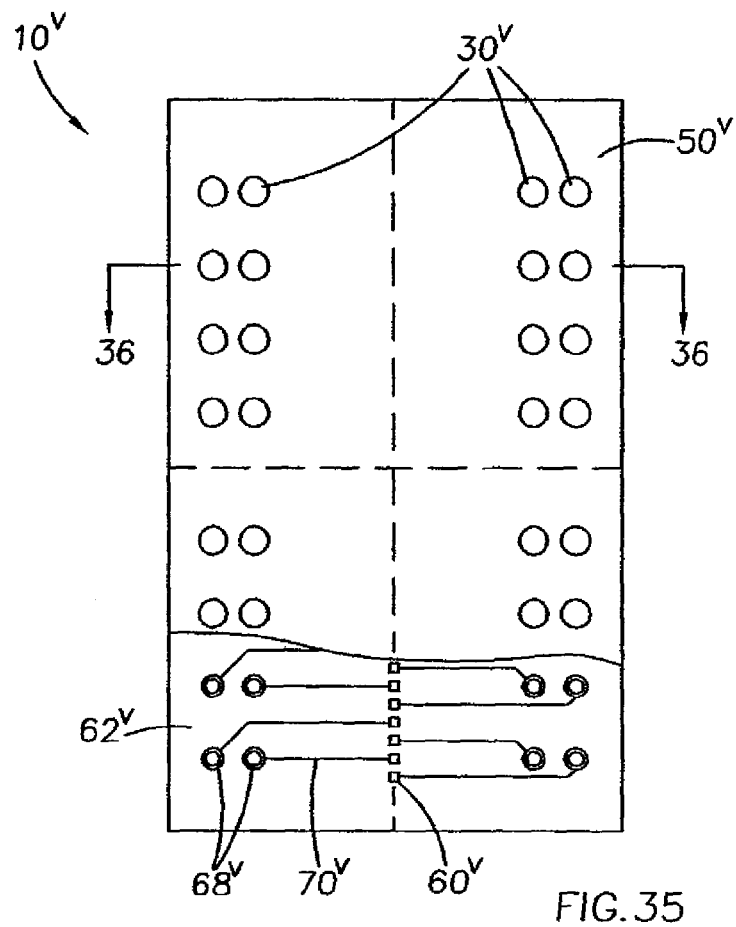
Figure 36:
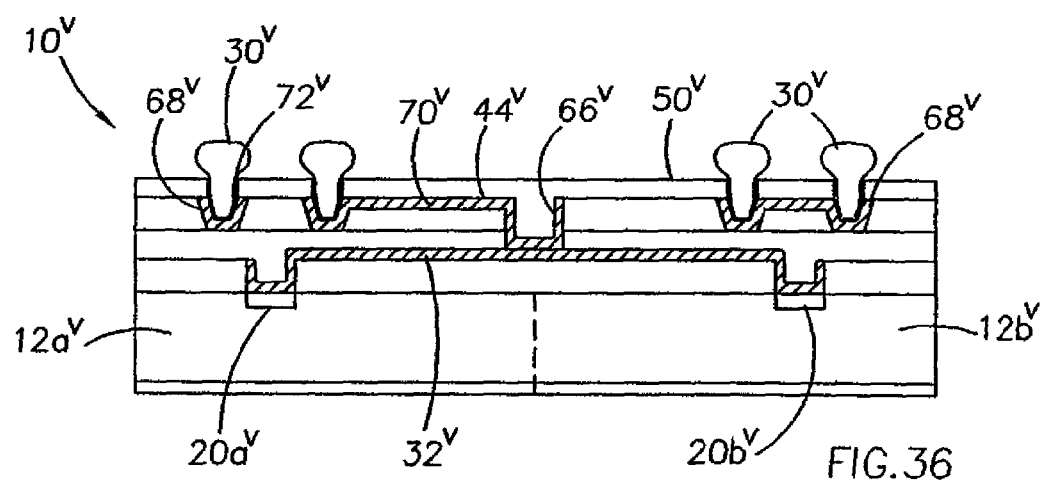

A second insulating layer $62^v$ is formed over the insulating layer $38^v$ as depicted in FIGS. 32-33, and is patterned and etched to provide openings $64^v$ and to extend opening 60'. As shown in FIG. 32 and in cross-section in FIG. 34, a second RDL $44^v$ is then applied onto the insulating layer $62^v$ to form via interconnects $66^v$ within opening $60^v$ connected to interconnecting traces $32^v$, ball pads $68^v$, and traces $70^v$ that interconnect the ball pads $68^v$ to every other via interconnect $66^v$ in a staggered arrangement. As depicted in FIGS. 35-36, an insulating layer $50^v$ can then be applied over the second RDL $44^v$ to form a passive exterior layer, with openings $72^v$ to the ball pads $68^v$. Ball contacts $30^v$ can then be connected to the ball pads $68^v$. This arrangement of vias $66^v$ and trace connections $70^v$ of vias $66^v$ to the ball pads $68^v$ provides closely matched RDL lengths from the bond pads $20a^v$, $20b^v$ to the ball pads $68^v$.

Referring to FIG. 2, the inactive surface 52 of the wafer level package 10 can be covered with a protective dielectric layer 54 such as a photoresist or spun-on polyimide, for example, which can be applied after backgrinding of the wafer or other substrate 14, and prior to singulation. Ideally, the electrical testing and burn-in of the dies is performed before the substrate (wafer) 14 is singulated into individual packages 10. The packaged dies 10 can be severed from the substrate (wafer) 14 singularly or in groups as desired. It is also contemplated that an entire unsevered wafer 14 can be tested and burned-in, and then used as fabricated as a wafer-scale package, particularly for large-capacity memory applications. The finished wafer level package 10 can be mounted as a component on an end user's printed circuit board or other external electrical apparatus or device via the ball contacts 30 using known techniques.

Two or more wafer level packages 10 can be combined, for example, into an integrated circuit module to enhance or extend the functionality of individual dies. A circuit module can comprise a combination of dies representing a variety of functions or containing the same functionality. Examples of integrated circuit modules include memory modules, device drivers, power modules, communication modems, processor modules and application-specific modules and may include multilayer, multi-chip modules. Examples of multi-chip modules (MCMs) include a single in-line memory module (SIMM), a dual in-line memory module (DIMM), a random access memory (RAM) card or module, and a read-only-memory (ROM) card or module. The circuit module can be a subcomponent of a variety of electronic systems, for example, a personal computer, cellular phone, clock, television, automobile, industrial control system, among others.

Figure 37:
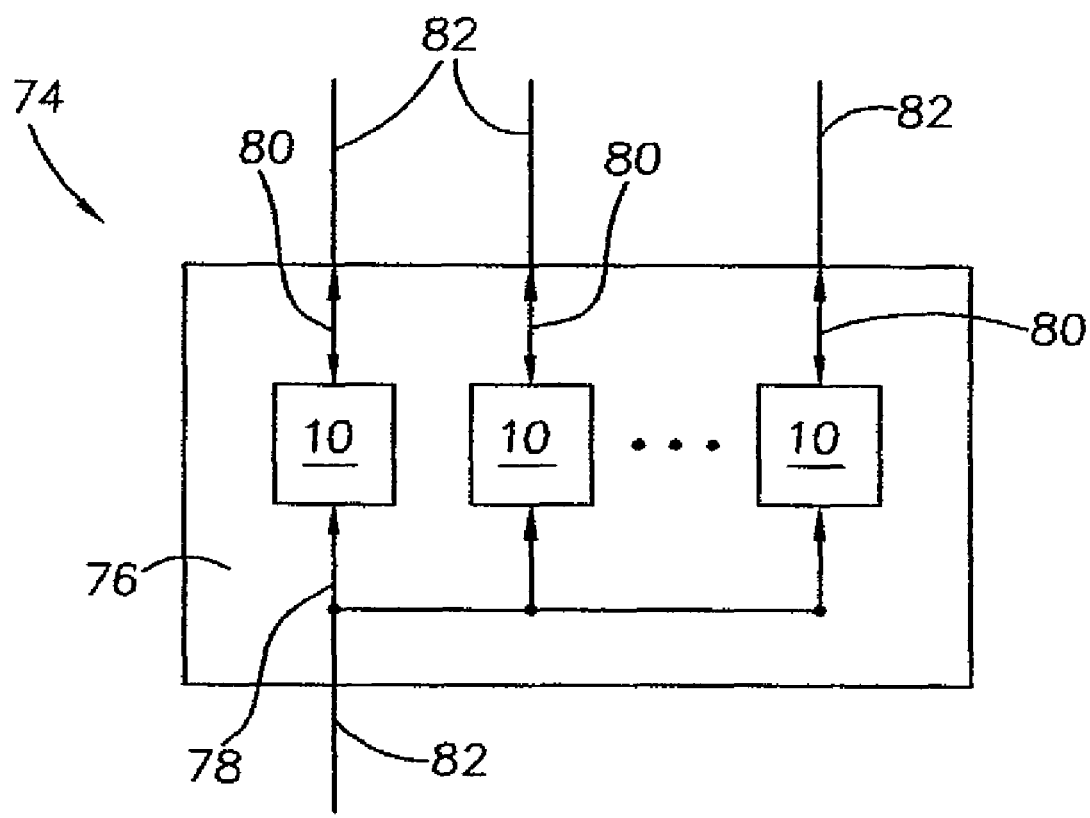
FIG. 37 is a block diagram of a memory module incorporating a plurality of wafer level packages.

FIG. 37 schematically depicts an embodiment of an integrated circuit module as a multi-chip memory module 74, such as a SIMM or DIMM, which are generally a printed circuit board (PCB) or other support containing a series of memory devices, or a memory card or any other memory die-carrying substrate. A SIMM typically comprises a single inline set of contacts or leads, and a DIMM typically comprises a set of leads on each side of the support with each set representing separate I/O signals. As depicted, the memory module 74 comprises multiple wafer level packages 10 disposed on a support 76, the number of packages 10 depending upon the desired bus width and the desire for parity. Wafer level packages 10 can be disposed on both sides of the support 76. Typically, the memory module 74 accepts a command signal from an external controller (not shown) on a command link 78 and provides for data input and data output on data links 80, both of which are connected to leads 82 extending from the support 76.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a die package, comprising:
    forming a first redistribution layer over at least two dies on a substrate, the first redistribution layer comprising a trace interconnecting a bond pad of each of two of said dies;
    forming an insulating layer over the first redistribution layer with an opening to expose said trace of the first redistribution layer; and
    forming a second redistribution layer over the insulating layer, the second redistribution layer comprising a plurality of ball pads and traces, a via interconnect in the opening of the insulating layer in contact with said trace of the first redistribution layer, and a trace of the second redistribution layer connecting the via interconnect to a single ball pad, wherein said interconnected bond pads are connected to a single ball pad.

2. The method of claim 1, further comprising:
    forming an insulating layer over the second redistribution layer;
    forming openings to expose the ball pads; and
    connecting ball contacts to the ball pads of the second redistribution layer.

3. The method of claim 1, wherein the substrate comprises a wafer, and the method further comprises:
    singulating the wafer to form individual packages, each package comprising said two interconnected dies.

4. The method of claim 1, wherein the substrate comprises a semiconductor wafer.

5. A method of fabricating a die package, comprising:
    forming a first insulating layer over at least two dies with openings to bond pads on the two dies;
    forming a first trace over the first insulating layer, the first trace interconnecting a bond pad of two of said dies;
    forming a second insulating layer over the first trace with an opening exposing the first trace; and
    forming a ball pad and a second trace over the second insulating layer, and a via interconnect in the opening in contact with the first trace, the second trace connecting the via interconnect to the ball pad, wherein said interconnected bond pads are connected to a single ball pad.

6. The method of claim 5, further comprising:
    forming a third insulating layer over the second trace with an opening to said ball pad;
    forming a contact on said ball pad;
    singulating the at least two dies to form the die package; and
    assembling the die package into an integrated circuit module.

7. The method of claim 5, wherein at least one die comprises integrated circuitry to perform a memory function.

8. The method of claim 5, further comprising, prior to forming the first trace:
    forming an insulating layer over the at least three dies on the substrate;
    forming openings to the bond pads on the first and second dies; and
    forming the first trace over said insulating layer.

9. A method of fabricating an integrated circuit module, comprising:
    forming a plurality of die packages on a substrate, each die package comprising three or more semiconductor dies, a first insulating layer over the three or more dies, a first redistribution layer over the first insulating layer comprising a single trace interconnecting a bond pad of each of first and second dies, an insulating layer over the first redistribution layer with openings to the bond pads of the three or more dies, and a second redistribution layer on the second insulating layer comprising a ball pad connected to a trace interconnecting said interconnected bond pad of either the first die or the second die to a bond pad of a third die, wherein said interconnected bond pads of the first, second and third dies are connected to a single ball pad;
    separating each package on the substrate to form individual packages; and
    assembling one or more packages into an integrated circuit module.

10. A method of fabricating an integrated circuit module, comprising:
    forming a wafer level package comprising first and second semiconductor dies on a semiconductor wafer, each said first and second dies comprising at least one bond pad, an insulating layer over the dies, traces and a ball pad over the insulating layer, a bond pad of each of said first and second dies interconnected by a first trace and one of said interconnected bond pads connected by a second trace to the ball pad, wherein said interconnected bond pads are connected to a single ball pad;
    separating each package on the substrate to form individual packages; and assembling one or more packages into an integrated circuit module.

11. A method of fabricating a die package, comprising:
forming a first trace interconnecting a bond pad of a first and second die on a substrate;
forming an insulating layer over said first trace;
forming an opening through the insulating layer to expose the first trace;
forming a via interconnect within the opening to the first trace; and
forming a second trace on the insulating layer to connect the via interconnect to a ball pad on the insulating layer such that the interconnected bond pads of the two dies are interconnected to a single ball pad.

12. The method of claim 11, further comprising, prior to forming the first trace:
forming a first insulating layer over the first and second dies on the substrate;
forming openings through the first insulating layer to said bond pads on the first and second dies; and
forming the first trace over said first insulating layer to connect said bond pads of the first and second dies.

13. The method of claim 12, further comprising, after forming the insulating layer over said first trace,
forming an opening through the insulating layers to expose a bond pad of a third die; and
forming a second via interconnect within the opening to the bond pad of the third die;
wherein forming the second trace includes connecting the via interconnect to the first trace to the via interconnect to said bond pad of the third die such that the bond pads of the first, second and third dies are interconnected to a single ball pad.

14. A method of fabricating a die package, comprising:
forming a plurality of dies on a substrate wherein a first trace solely interconnects a bond pad of a first and second die, an insulating material overlies the first trace, a via interconnect extends through said insulating material to the first trace and to a second trace on the insulating material, the second trace connected to a ball pad, wherein the interconnected bond pads of the first and second dies are connected to a single ball pad.

15. The method of claim 14, wherein the second trace is connected to a bond pad on a third die such that the bond pads of the first, second and third dies are interconnected to a single ball pad.

16. The method of claim 15, wherein a trace connects said bond pad of the third die to a bond pad on a fourth die on the substrate such that the bond pads of the first, second, third and fourth dies are interconnected to a single ball pad.

17. The method of claim 14, wherein a plurality of die packages are formed on the substrate, and the method further comprises singulating the substrate to separate each die package to form individual packages.

18. The method of claim 14, wherein the substrate comprises a semiconductor wafer.

19. The method of claim 14, further comprising assembling said die package into an integrated circuit module.

20. The method of claim 19, wherein the integrated circuit module comprises a multi-chip module.

21. The method of claim 20, wherein the multi-chip module is selected from the group consisting of a single in-line memory module, a dual in-line memory module, a random access memory card or module, and a read-only-memory card or module.

22. A method of fabricating a die package, comprising:
forming a first trace interconnecting a bond pad of a first and second die of at least three dies situated on a substrate;
forming an insulating layer over said first trace;
forming an opening through the insulating layer to expose the first trace and a bond pad of a third die;
forming a via interconnect within the opening to the first trace; and
forming a second trace on the insulating layer to connect the via interconnect to the bond pad of the third die and to a ball pad such that the interconnected bond pads of the first, second and third dies are interconnected to a single ball pad.

* * * * *